United States Patent [19]

Dolby

[11] Patent Number: 4,736,433
[45] Date of Patent: Apr. 5, 1988

[54] CIRCUIT ARRANGEMENTS FOR MODIFYING DYNAMIC RANGE USING ACTION SUBSTITUTION AND SUPERPOSITION TECHNIQUES

[76] Inventor: Ray M. Dolby, 3340 Jackson St., San Francisco, Calif. 94118

[21] Appl. No.: 848,622

[22] Filed: Apr. 8, 1986

Related U.S. Application Data

[63] Continuation-in-part of Ser. No. 744,963, Jun. 17, 1985, abandoned.

[51] Int. Cl.$^4$ ............................................. H03G 7/00
[52] U.S. Cl. ....................................... 381/106; 333/14
[58] Field of Search ......................... 333/14; 381/106; 358/144

[56] References Cited

U.S. PATENT DOCUMENTS

| | | | |
|---|---|---|---|
| Re. 30,468 | 12/1980 | Dolby et al. | 455/72 |
| 3,795,876 | 3/1974 | Takahashi et al. | 333/14 |
| 4,363,007 | 12/1982 | Haramoto et al. | 333/14 |
| 4,412,100 | 10/1983 | Orban | 381/100 |
| 4,490,691 | 12/1984 | Dolby | 333/14 |
| 4,498,060 | 2/1985 | Dolby | 333/14 |

Primary Examiner—Forester W. Isen
Attorney, Agent, or Firm—Majestic, Gallagher, Parsons & Siebert

[57] ABSTRACT

Circuits for modifying the dynamic range of signals, particularly compressors and expanders for use in noise reduction compander systems, in which the plurality of characteristics are superposed such that as dominant signal components appear, hidden characteristics are revealed and become active. The emergence of characteristics can also be described as "action substitution" in the sense that the action resulting from one, or perhaps more than one characteristic is substituted for one or more other characteristic actions that have the potential to operate in the same frequency and level regions when the level and spectral content of the input signal components change. One particularly useful combination of superposed characteristics is a fixed band characteristic (variable attenuation throughout all or part of the frequency band) and a sliding band characteristic (variable attenuation through part of the frequency band achieved by a variable pass filter). The advantages of such characteristics are obtained, without the disadvantages normally inherent in each characteristic. Fixed band and sliding band circuit elements are operated in various equivalent circuit topologies: in the preferred and simplest arrangement the circuit elements are in a "stack", the output of one element acting as a reference for the other. The elements operate in generally the same level range and at least a partial overlapping in frequency range.

36 Claims, 16 Drawing Sheets

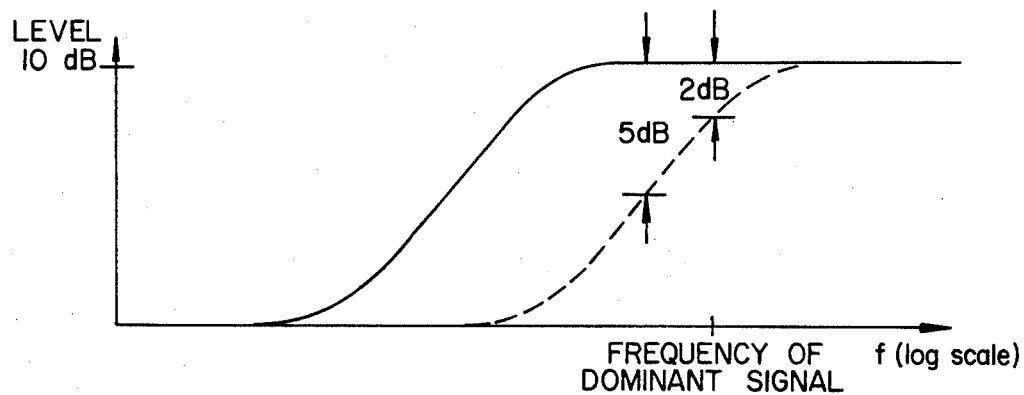
FIG._1.
(PRIOR ART)
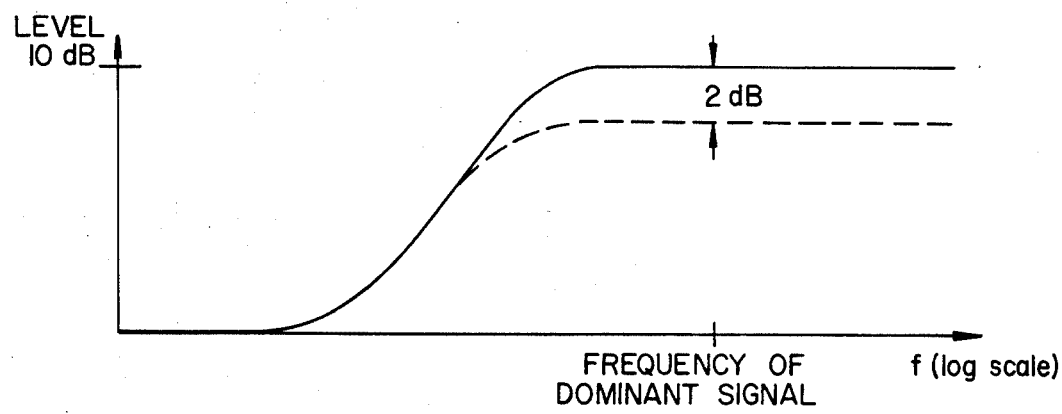
FIG._2.
(PRIOR ART)
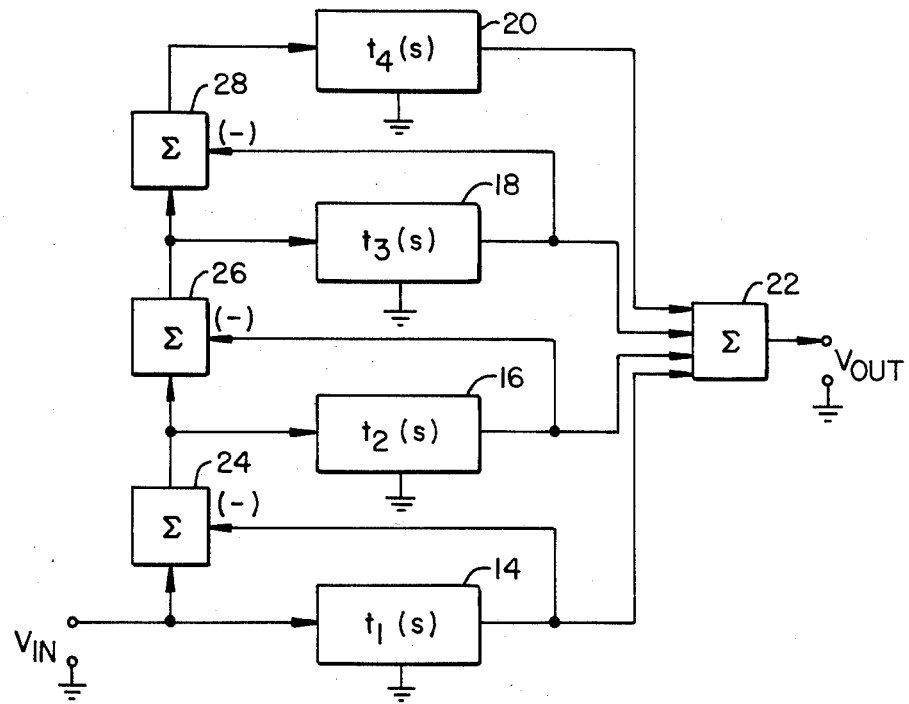
FIG._3.

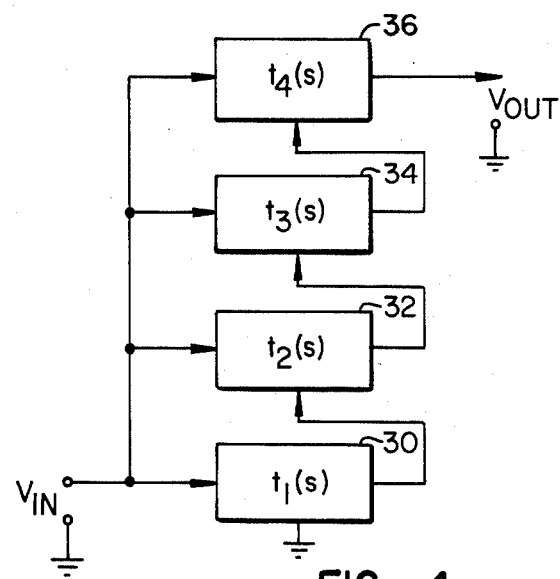
FIG._4.
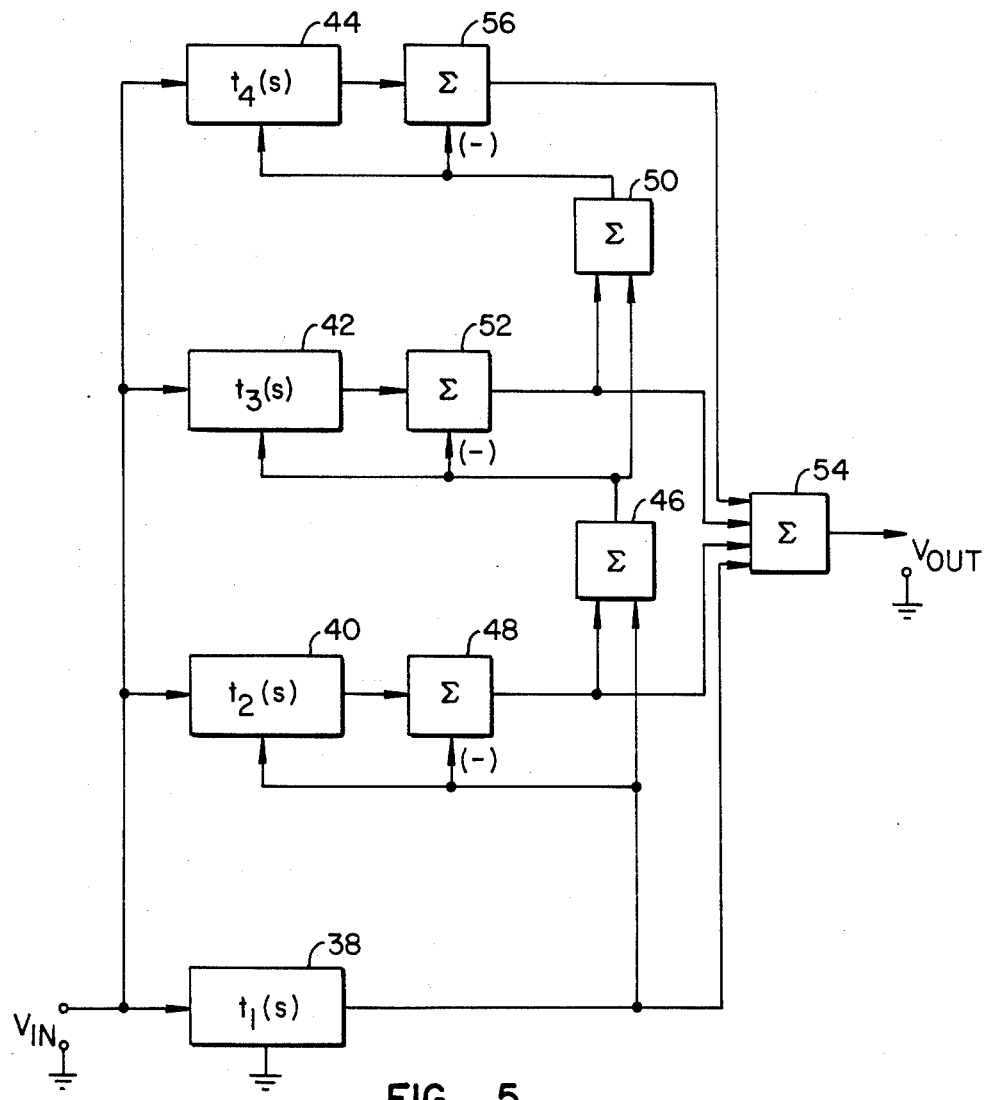
FIG._5.

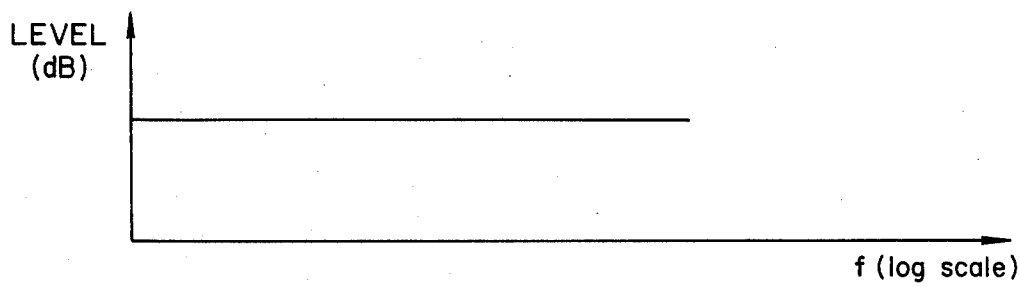
FIG._6A.
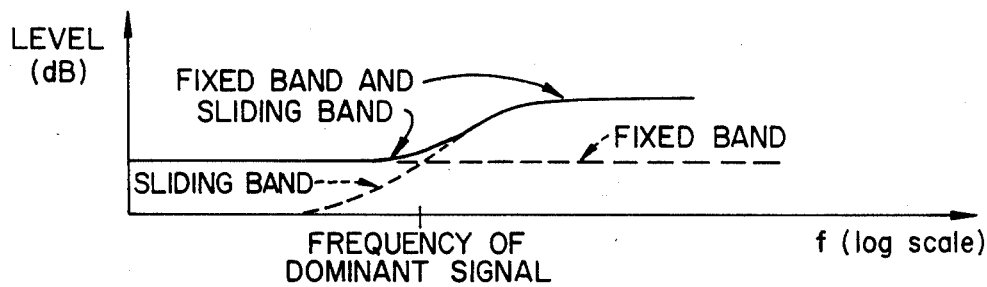
FIG._6B.
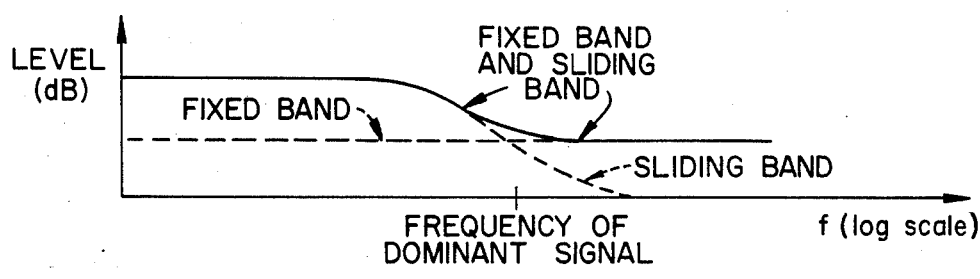
FIG._6C.
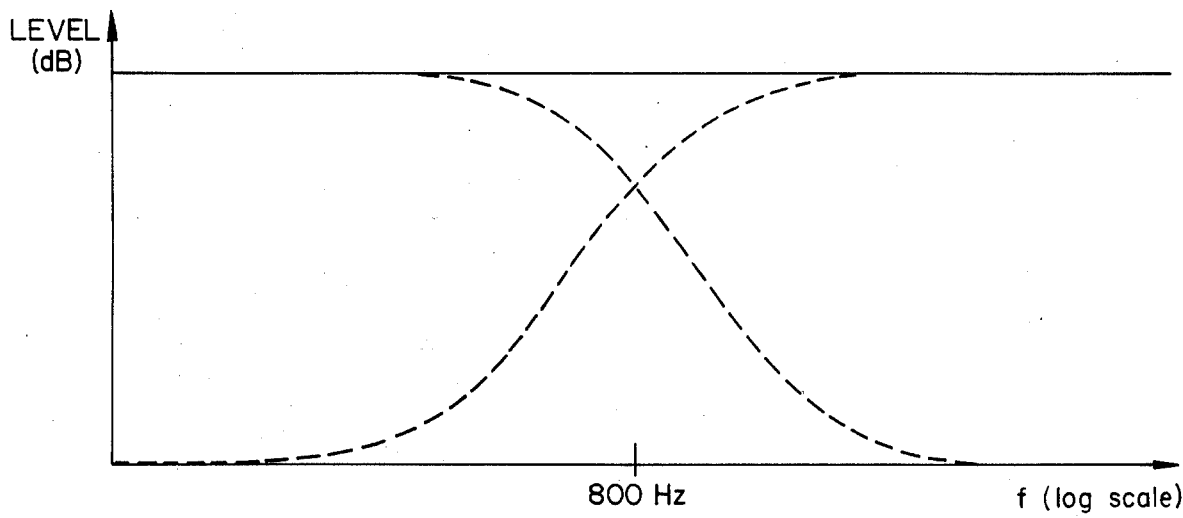
FIG._7A.

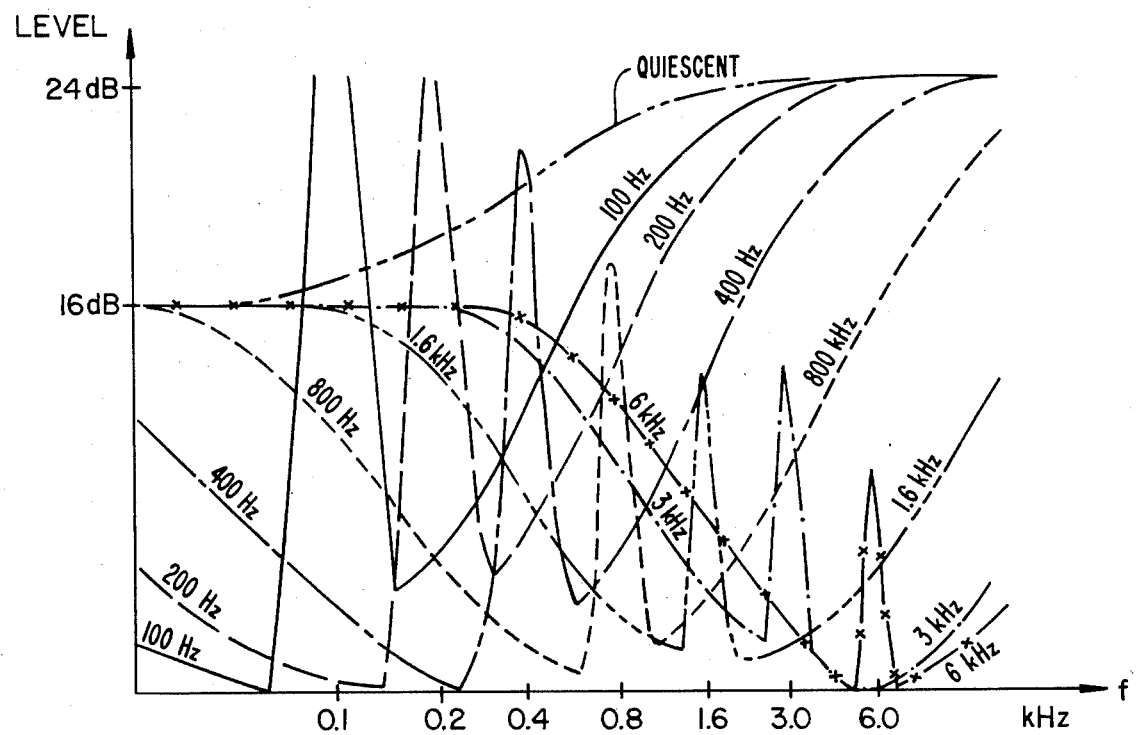
FIG._7B.
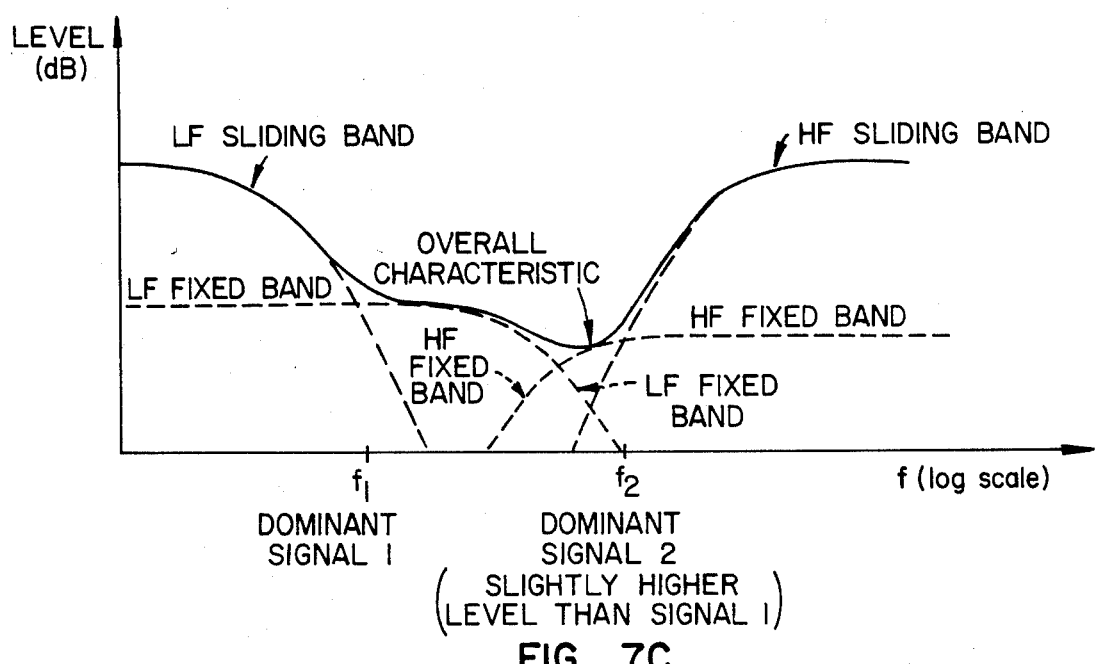
FIG._7C.

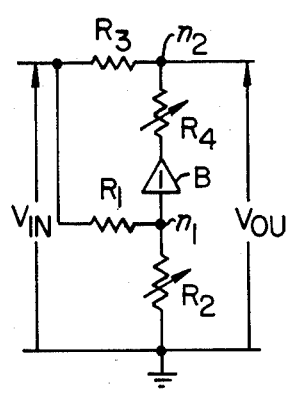
FIG._8.
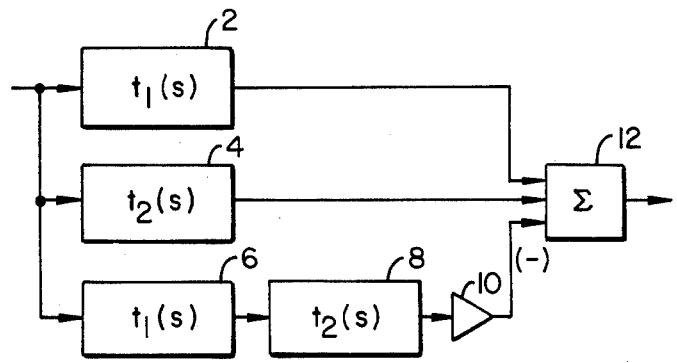
FIG._9.
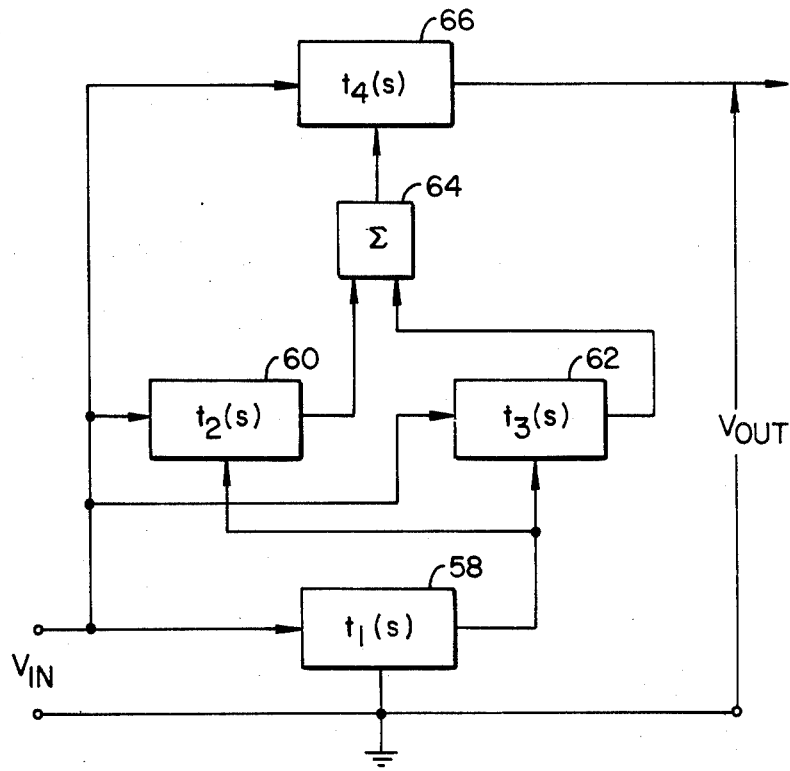
FIG._10.

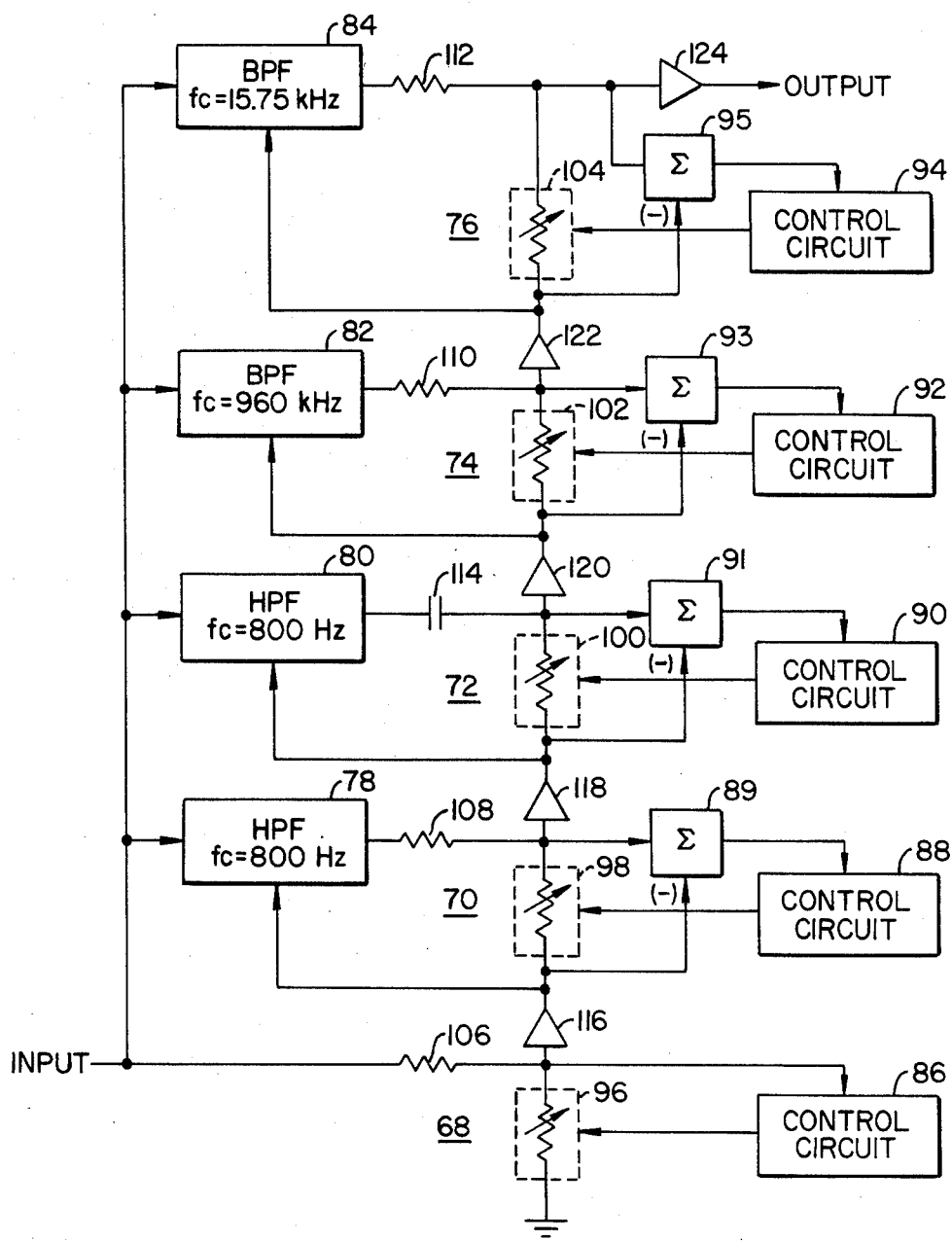
FIG._11.

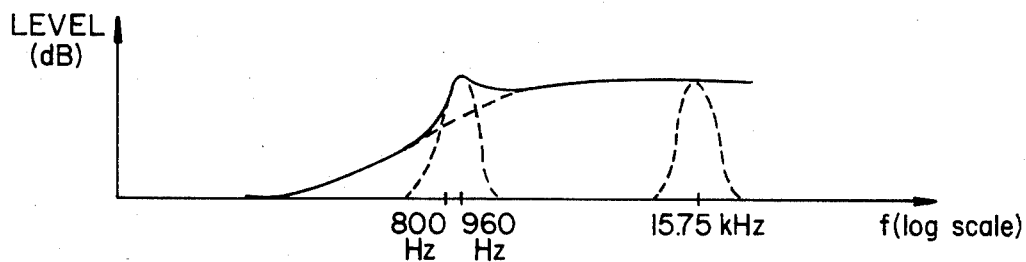
FIG._12A.
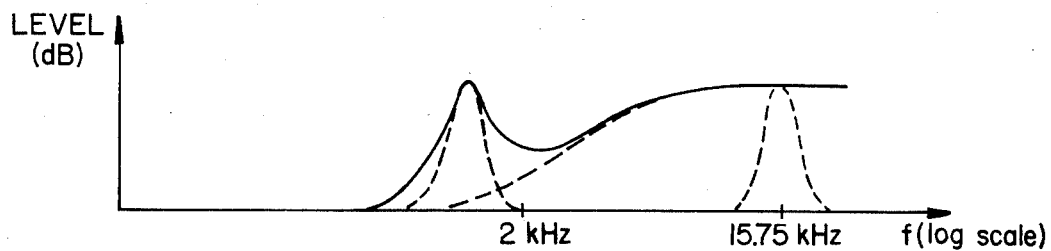
FIG._12B.
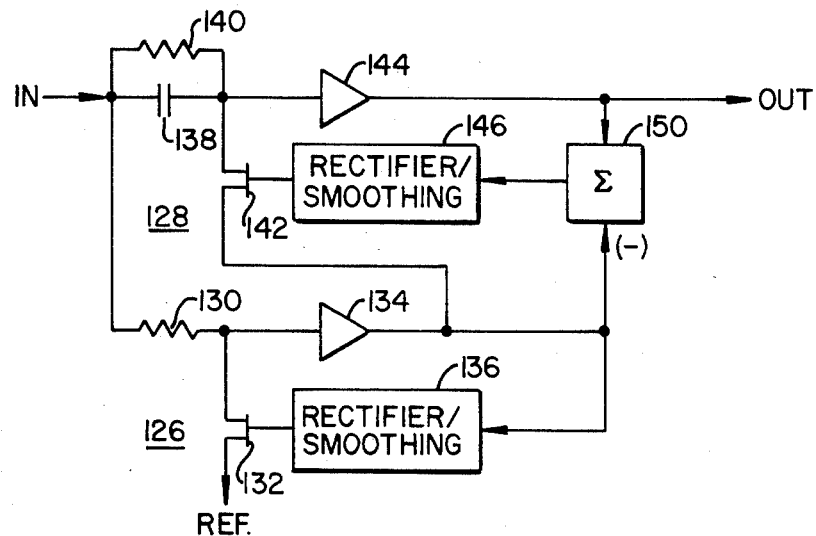
FIG._13.

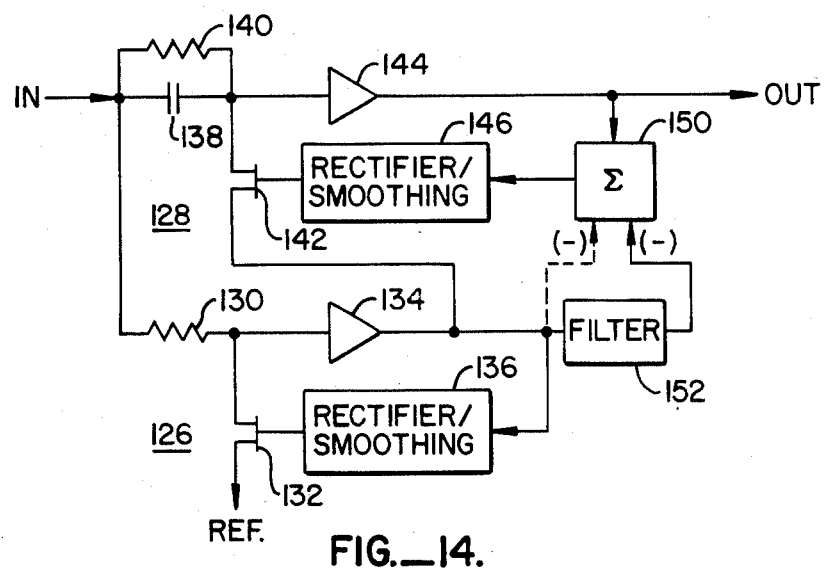
FIG._14.
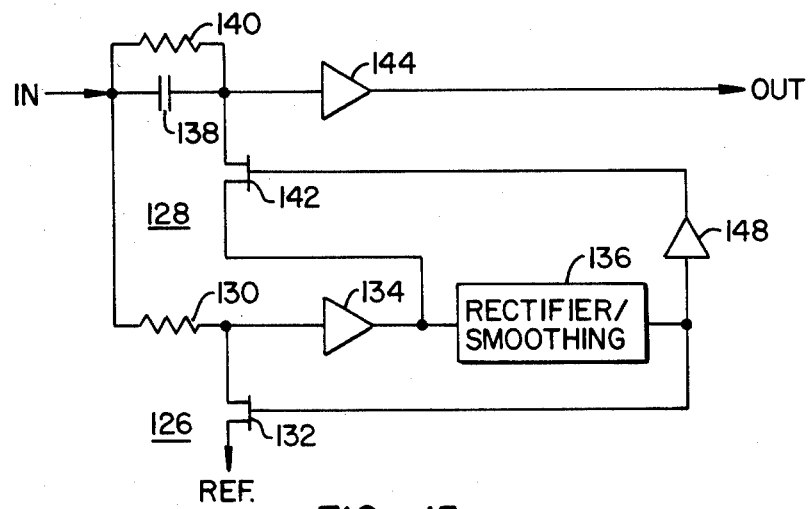
FIG._15.

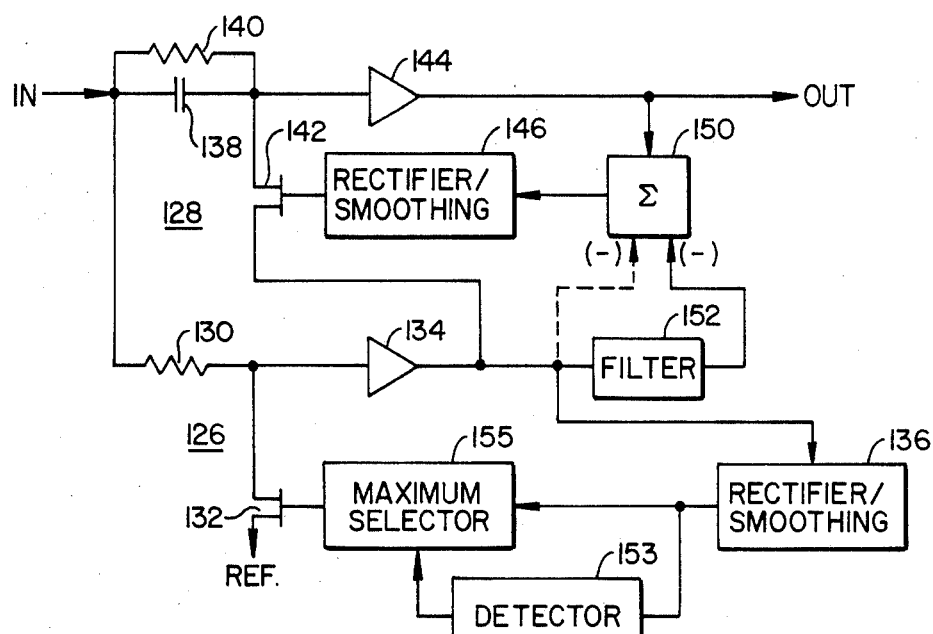
FIG._16A.
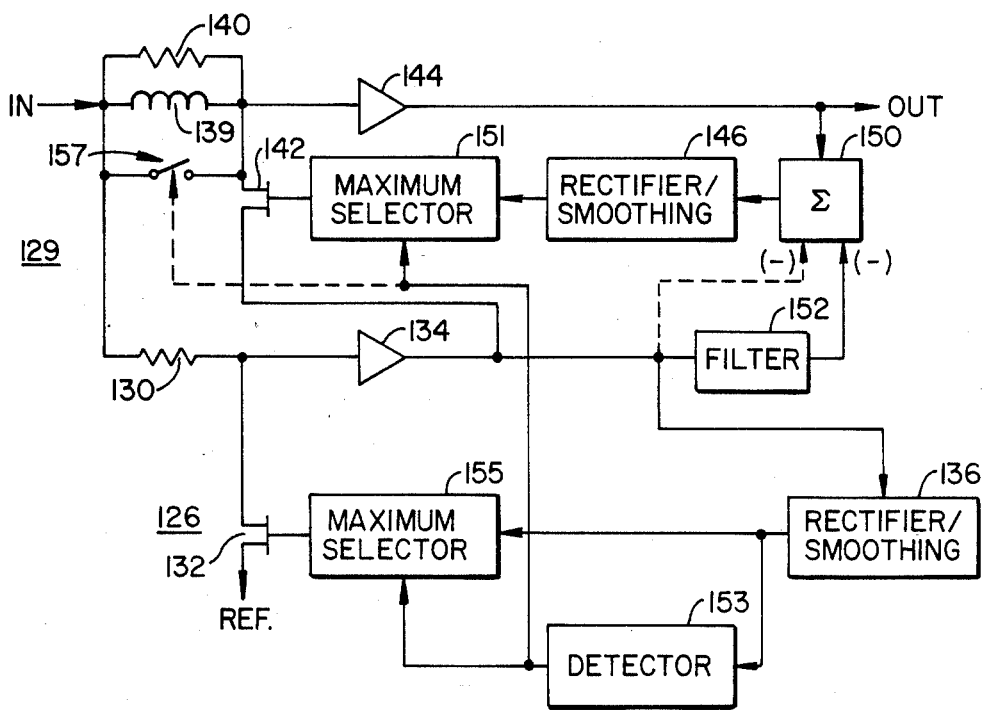
FIG._16B.

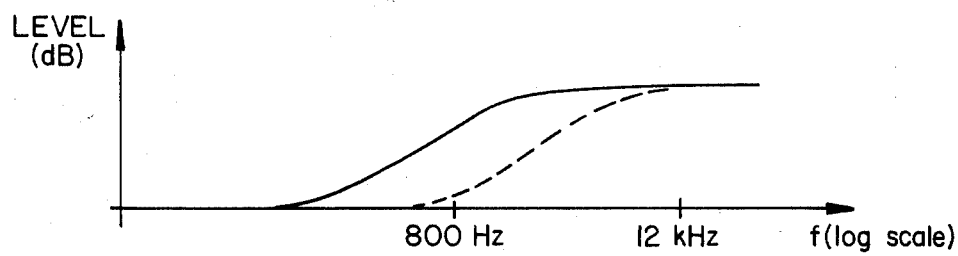
FIG._17A.
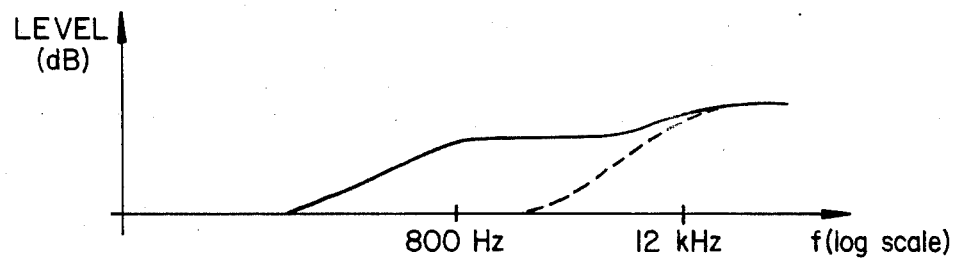
FIG._17B.
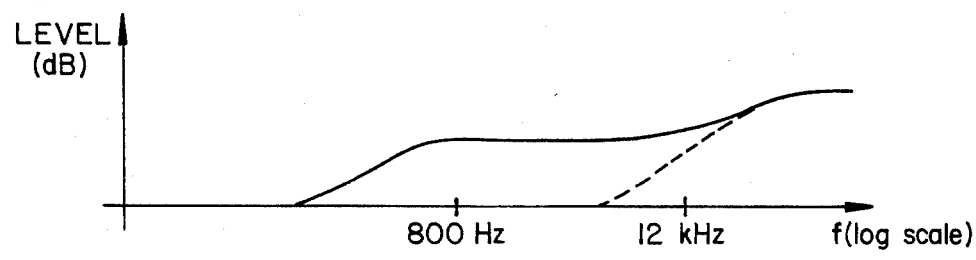
FIG._17C.

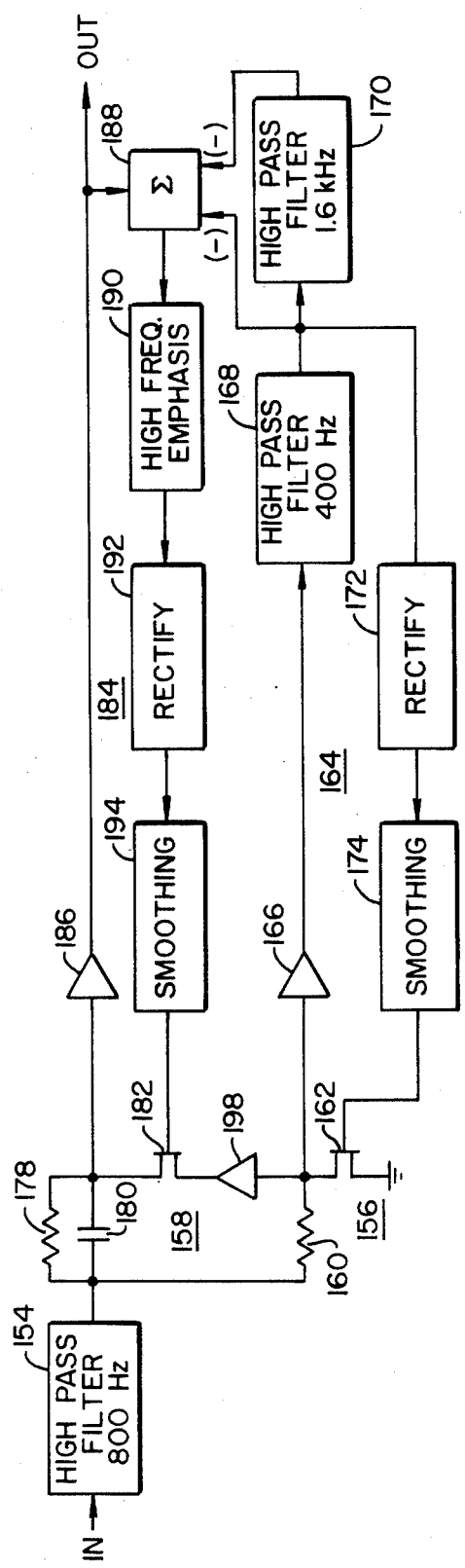
FIG._18.
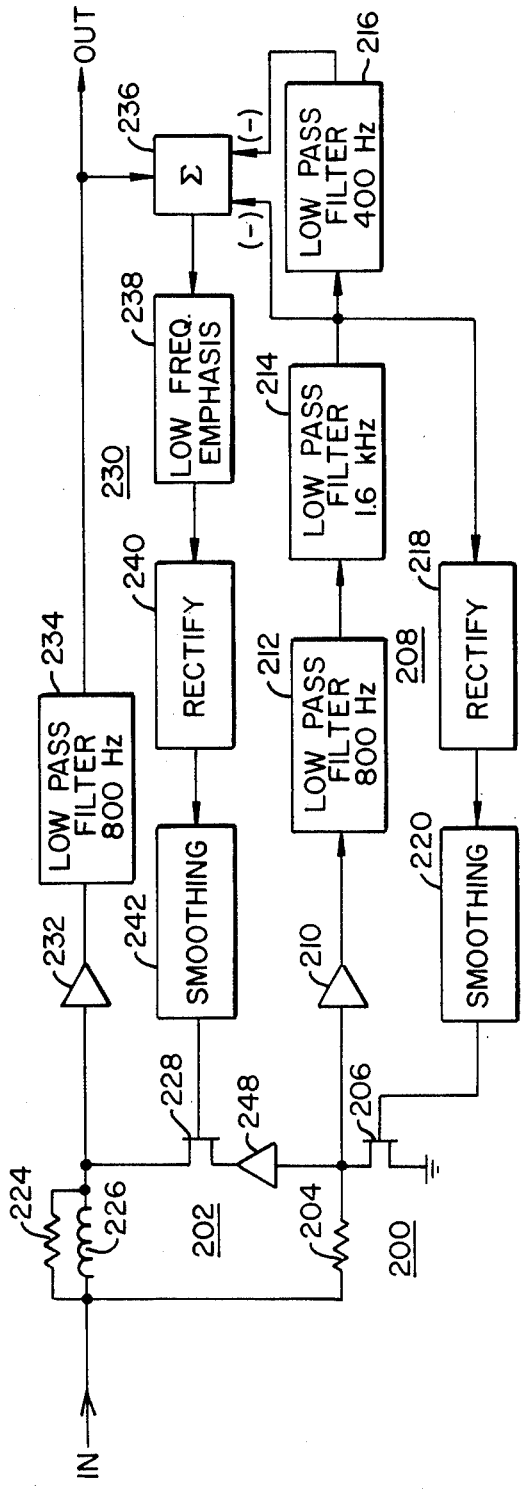
FIG._19.

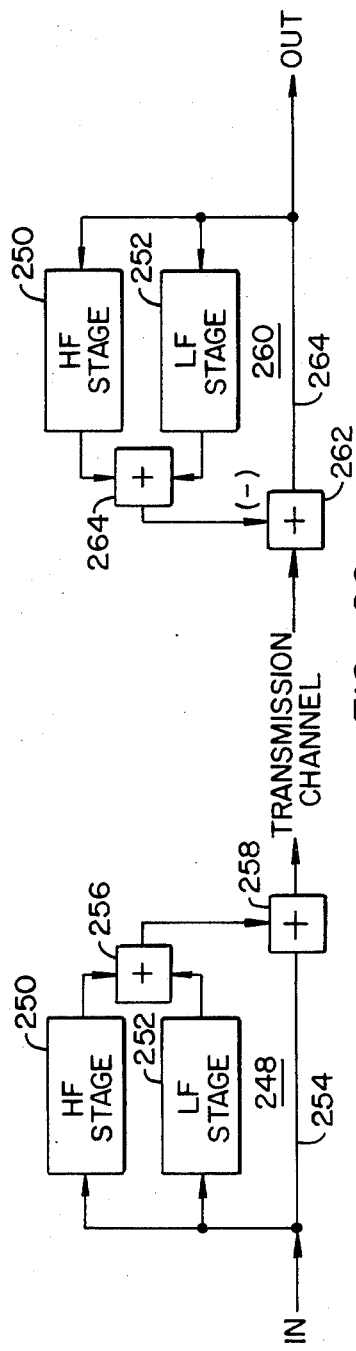
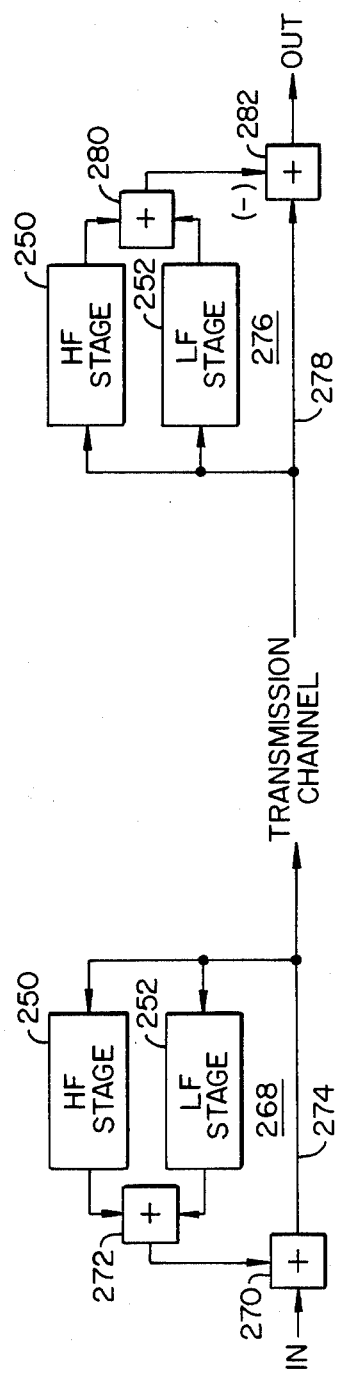
FIG._20.
FIG._21.

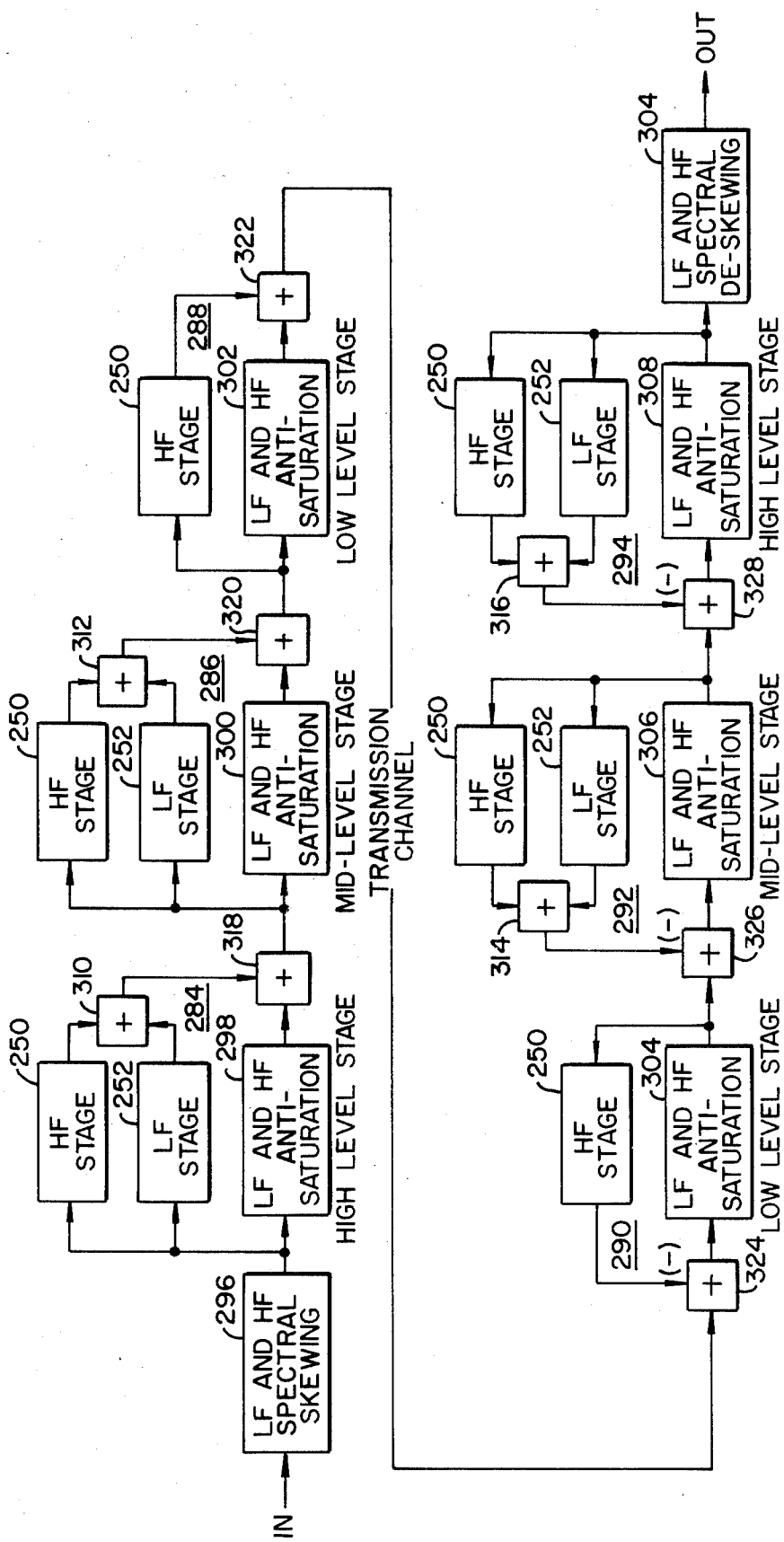
FIG._22.

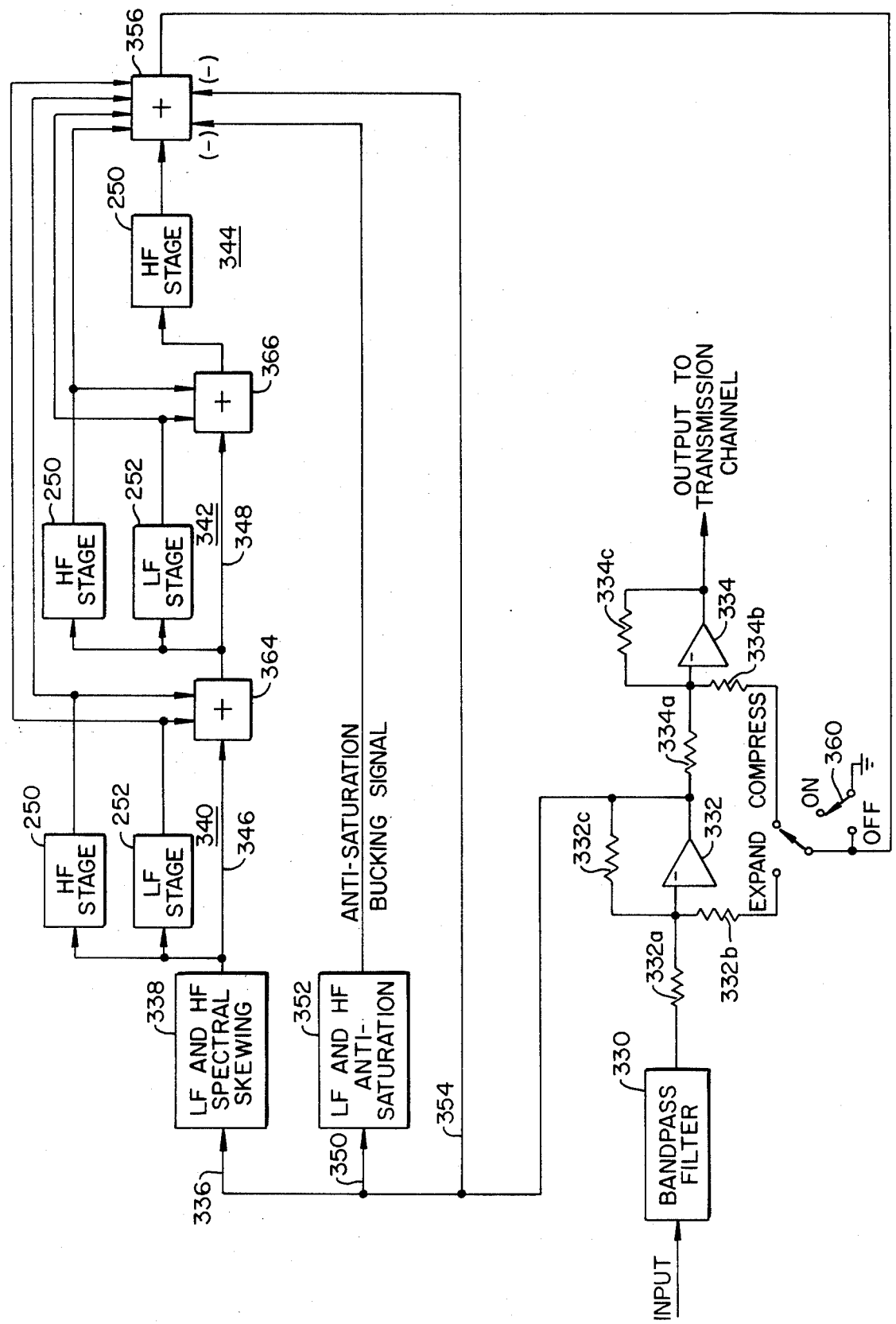
FIG._23.

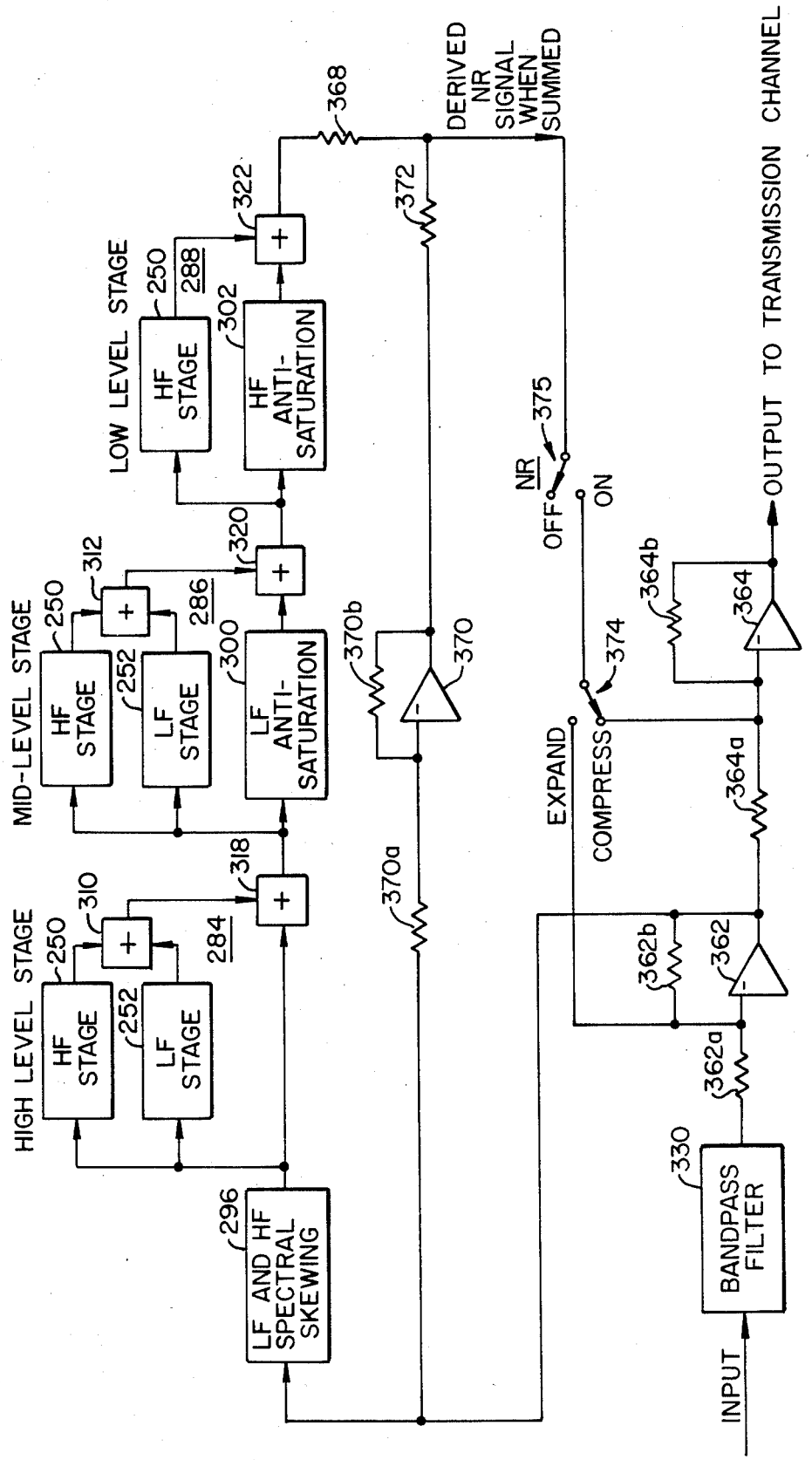
FIG.—24.

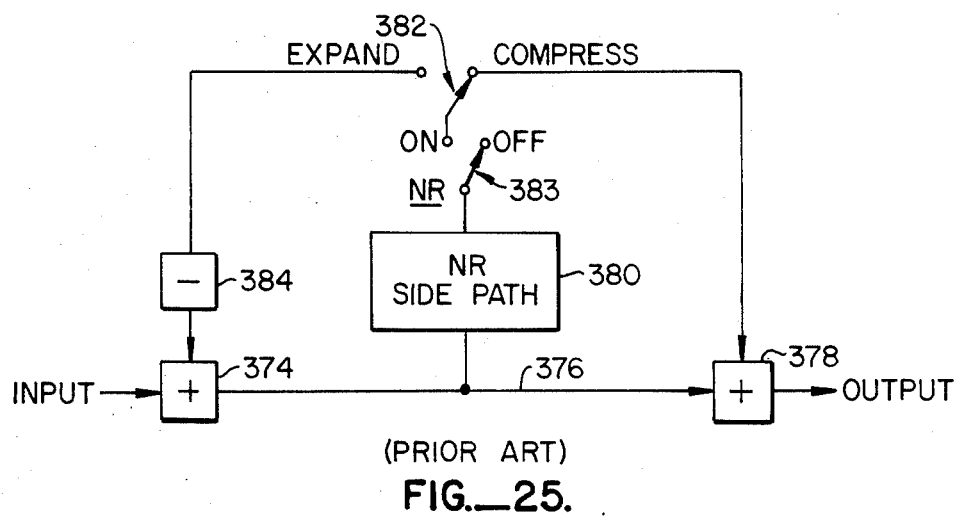
(PRIOR ART)
FIG._25.
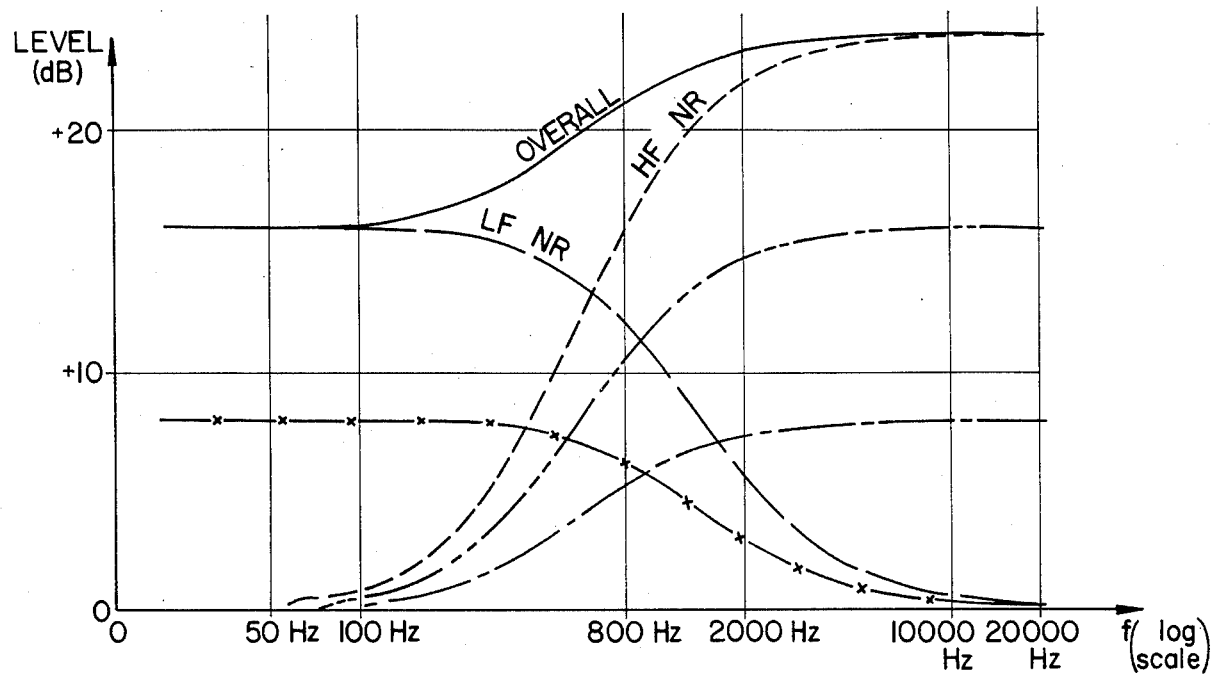
FIG._26.

CIRCUIT ARRANGEMENTS FOR MODIFYING DYNAMIC RANGE USING ACTION SUBSTITUTION AND SUPERPOSITION TECHNIQUES

CROSS REFERENCE TO RELATED APPLICATIONS

This is a continuation-in-part of my copending application Ser. No. 06/744,963, filed June 17, 1985, now abandoned.

BACKGROUND OF THE INVENTION

The present invention is concerned in general with circuit arrangements which alter the dynamic range of signals, namely compressors which compress the dynamic range and expanders which expand the dynamic range. While the invention is useful for treating various types of signals, including audio signals and video (television) signals, the description of the invention is primarily in the context of the processing of audio signals. The principles of the invention may be applied to the processing of other signals by modifying the disclosed embodiments by applying known techniques. For example, compressors and expanders for video signals can act instantaneously and do not require syllabic control circuitry.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, a single device is often configured for switchable mode operation as a compressor to record signals and as an expander to play back compressed broadcast or pre-recorded signals.

One long sought after goal in the design of compressors, expanders and companding type noise reduction systems is a high degree of adaptiveness of the compressor and expander to applied signals. That is, the compressor, for example, ideally should provide constant gain throughout its frequency spectrum of operation except at the frequency of a dominant signal component where it would provide dynamic action according to a predetermined compression law. This goal was referred to as "conformal equalization" in U.K. Provisional Specification No. 43136 filed Oct. 11, 1965 by this inventor. Accordingly, that document (along with two other U.K. Provisional Specifications of this inventor, Nos. 34394 and 02368, filed Aug. 11, 1965 and Jan. 18, 1966, respectively) and subsequent patents derived therefrom (including U.S. Pat. Nos. 3,846,719 and 3,903,485) employed several techniques directed to achieving that goal, including, among others, techniques now commonly known as "band-splitting" and "sliding band".

According to the bandsplitting approach, the spectrum is divided into a plurality of frequency bands, each of which is acted upon independently. In that way a dominant signal component affects dynamic action (compression or expansion) only within a portion of the overall spectrum, in contrast to a wideband approach in which dynamic action throughout the entire spectrum is affected by a dominant signal component. Thus, a bandsplitting system provides a greater degree of adaptiveness or conformance than a wideband system. In theory, a highly adaptive or conformal system could be provided by dividing the overall spectrum into a very large number of frequency bands; however, the complexity and cost of such an arrangement makes it impractical. Consequently, a design compromise is made by selecting a reasonable number of frequency bands capable of providing satisfactory performance. In one well known commercially successful bandsplitting companding type audio noise reduction system (commonly known as A-type noise reduction) four bands are employed ("An Audio Noise Reduction System", by Ray Dolby, J. Audio Eng. Soc., October 1967, Vol. 15, No. 4, pp. 383-388). However, such systems suffer from the same problems as does a wideband noise reduction system, although to a lesser degree because the band is divided up and the problems tend to be confined to the individual bands. These problems are well known in the design of noise reduction systems and include loss of noise reduction effect and the related problems of noise modulation and signal modulation at frequencies not masked by the dominant signal component when a change of gain takes place in response to a dominant signal component. Such problems are chiefly a result of a system failing to be perfectly conformant to the dominant signal. The degree to which such problems are audible also depends on how far the system departs from perfect complementarity. If, for example, the transmission channel response is irregular or unpredictable within the passband of the compressor and expander, then signal modulation effects will not be compensated in the expander.

A dominant signal component is a signal component having a substantial enough level so as to effect dynamic action within the frequency band under consideration. Under complex signal conditions there may be more than one dominant signal component or a dominant signal component and sub-dominant signal components. In a compander system which relies on complementarity of the compressor and expander, all of the signal components must be compressed and expanded in accordance with a defined compression/expansion law in order that the signal spectrum including the dominant signal component (and other signals affected by dynamic action) can be restored to their correct levels in the expander. This requirement excludes the usefulness in compander systems of various known adaptive and tracking filter techniques and so-called "single ended" noise reduction systems (which operate only on a reproduced signal) in which the filter action is not subject to predetermined compression/expansion laws and whose action may be unpredictable in the presence of multiple signals.

Another approach useful in working toward the goal of increased adaptiveness or conformance is the sliding band technique, which employs signal dependent variable filtering to achieve limiting. Generally, a dominant signal component causes the cutoff or turnover frequency (or frequencies) of one or more variable filters (e.g., high pass, low pass, shelf, notch, etc.) to shift so as to compress or expand the dominant signal component.

A sliding band system operating only in a single high frequency band is described in U.S. Pat. Nos. Re. 28,426 and 4,490,691. This system, which forms the basis for the well known consumer companding type audio noise reduction system known as B-type noise reduction, includes, in a dual path arrangement, a side path having a fixed high pass filter in series with a variable filter.

A "dual path" arrangement is one in which a compression or expansion characteristic is achieved through the use of a main path which is essentially free of dynamic action and one or more secondary or side paths having dynamic action. The side path or paths take their input from the input or output of the main path and their output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main path signal components. Such dual path arrangements are described in detail in U.S. Pat. Nos. 3,846,719; 3,903,485; 4,490,691 and U.S. Pat. No. Re. 28,426.

A high frequency variable shelving filter in a single path arrangement (e.g., the dynamic action is accomplished in a single signal path) for a companding audio noise reduction system is set forth in U.S. Pat. No. 3,911,371. In the embodiments of FIGS. 1 and 2 of U.S. Pat. No. 3,665,345 a dual path arrangement is set forth in which the side path comprises a variable shelving filter having an all-pass characteristic in its quiescent condition. Another approach for providing a variable shelving response for compander systems is set forth in U.S. Pat. No. 3,934,190.

One drawback of these sliding band arrangements is that in the presence of a dominant high frequency signal component the variable filter turnover frequency shifts to a frequency above that signal component thereby restricting the frequency area at lower frequencies in which noise reduction is provided. The loss of noise reduction may be more noticeable audibly than in band-splitting systems and the related side effects (noise modulation and signal modulation) may be more severe than in fixed band arrangements because of a multiplication effect that is inherent in sliding band systems. This effect results from the way in which sliding band systems provide compression. If, for example, there is a dominant high frequency signal and 2 dB of gain reduction is required at that frequency, the variable filter cutoff frequency should shift to the extent necessary to provide that amount of attenuation along the filter slope. However, for lower frequencies, further removed from the new filter cutoff frequency, the effect may be 5 or 10 dB of dynamic action, for example, with a consequent loss of all or most of the noise reduction effect along with possible audible signal or noise modulation. In other words, in this example, a 2 dB change in a dominant signal can cause a 5 or 10 dB change in gain at frequencies removed from the dominant signal. FIG. 1 is an idealized compressor characteristic response curve illustrating this effect. (Throughout this document the characteristic response curves illustrated in the various Figures are those of compressors, it being understood that the respective expander characteristic is the complement of the compressor characteristic.) Under relatively rare conditions, when very high frequency dominant signal components (cymbals, for example) control the sliding band filter, there may be audible modulation of non-dominant mid-band signal components that are also present if the expander does not properly track the compressor. This problem is called the "mid-band modulation effect". One approach in solving the problem is set forth in said U.S. Pat. No. 4,490,691.

In a fixed band arrangement the same amount of gain reduction would occur throughout the frequency band (whether wide band or one frequency band of a band-splitting system) in response to a dominant signal component. Thus, while signal or noise modulation may occur, there is no multiplication of the effect: a 2 dB change in the level of a dominant signal component would cause no more than a 2 dB change in gain at frequencies removed from the dominant signal component. However, viewed from the standpoint of noise reduction effect this is a disadvantage of a fixed band arrangement—the full noise reduction effect is not obtained anywhere within the frequency band of operation when limiting occurs in response to a dominant signal component. FIG. 2 is an idealized compressor characteristic response curve illustrating this effect. Although it is not multiplied, there is also the potential for noise and signal modulation throughout the entire frequency band in which the fixed band action occurs.

Despite the disadvantages mentioned, an advantage of a sliding band arrangement is that the full noise reduction effect is obtained at frequencies above the dominant signal component (or below the dominant signal component in the case of a sliding band system acting downward in frequency). Thus an arrangement that achieves the advantages of fixed band and sliding band systems (e.g., the advantage of fixed band is that there is no multiplication of modulation effects and the advantage of sliding band is that there is minimum signal or noise modulation above the dominant signal frequency) without the disadvantages of each (e.g., the disadvantage of fixed band is noise and signal modulation throughout its operating range—although not multiplied and the disadvantage of sliding band is the mid-band modulation effect) would be desirable. The invention provides this combination.

The invention is not limited to arrangements in which the advantages of fixed band and sliding band systems are obtained without their disadvantages, but it is also applicable in general to arrangements where the advantages of various dynamic and passive characteristics are obtained in order to achieve compressor, expander and compander systems having a high degree of conformance or adaptation to dominant signals without undue circuit complexity.

SUMMARY OF THE INVENTION

The present invention is based on the recognition that the ideal of conformal equalization can be more closely approached by compressor, expander and compander type noise reduction arrangements in which a plurality of compression/expansion/equalization characteristics are superposed or overlaid upon one another in such a way that one or more of the characteristics is hidden or concealed until, as dominant signal components appear, the hidden characteristics are revealed and become active. Thus, according to the invention, the quiescent characteristic, which provides a defining umbrella or envelope that conceals one or more latent characteristics, is modified so that the latent characteristic or characteristics emerge in response to dominant signal components in order to provide a more effective adaptive equalization than provided by prior art circuit arrangements.

This unveiling of characteristics can be described as "action substitution" in the sense that the action resulting from one (or perhaps more than one) characteristic is substituted for one or more other characteristic actions that have the potential to operate in the same frequency and level regions when the level and spectral content of the input signal components change. Preferably, the substitution is such that, with respect to any non-dominant signal components, the transmission is maximimized in the compressor and minimized in the expander. The invention allows the designer of compressors, expanders and companding noise reduction systems greater flexibility in building up response characteristics without resorting to impractical circuit complexity. The invention provides compressors, expanders and noise reduction compander systems having improved abilities to discriminate among dominant and non-dominant signal components and to confine dynamic action to dominant signal components only. By providing a noise reduction encoder (compressor) which essentially maintains a constant boost except where there is a dominant signal component, the noise reduction decoder (expander) has a very stable noise floor, which is essential to a high quality noise reduction system.

In order to best implement superposition according to this invention an arrangement is required such that substantially full "action substitution" is obtained. In an action substitution arrangement, characteristics dynamically emerge and appear throughout all or part of the spectrum depending on the level and spectral content of dominant signal components. Action substitution provides for the revealing of latent characteristics. Ideally, in a superposition arrangement, a characteristic appears only if it can provide an optimal effect within all or part of the spectrum; that characteristic is then fully effective within that region. For example, in the case of a compressor, for non-dominant signal components, the ideal characteristic is that which provides the highest signal output; or, in the case of an expander, the lowest signal output. Each characteristic is substantially fully effective for non-dominant signal components except in the crossover region of effectiveness of the characteristics; in the crossover region, the overall combined characteristic does not exceed the maximum action of any of the characteristics acting alone. The maximum overall output is not greater than the maximum output of any single characteristic. The characteristics are hidden by one another, the one or ones exposed depending on which has the greatest effect at any particular frequency under the signal conditions at that instant.

For discussion purposes let the gains in a compressor system be arranged such that extremely low level signals pass through the apparatus without attenuation. That is, the maximum possible action is that of providing a gain of unity; somehow to achieve this gain over as broad a range of frequencies as possible, in the presence of higher level (dominant) signals, is the task of the system.

Thus, in a superposed action compressor, the output of the first filter and compressor element is noted. The output represents the completed part of the total potential action. The uncompleted part of the action is the input minus the completed part. The uncompleted part is therefore derived and fed into the next element to see what it can contribute (it would be wrong to feed the whole input signal into the second element, because this might result in double action). The output of the second element is the contribution of this particular element to the total action; its action (hopefully, more successful) augments the partially inadequate action of the first element. In an extreme case, in which the output of the first element may be negligible at a particular frequency, the action of the second element is effectively substituted for that of the first.

Any remaining potential action is then the input signal minus the outputs of the first two elements. Thus this difference signal is fed to the third element, etc. If there are enough elements, at least some of which have sufficient discrimination against the dominant signal(s) present, then at non-dominant frequencies the total of all the element gains will approach the desired sum of unity.

At the dominant frequency the gain of the overall compressor cannot be allowed to be unity but must obey a specified compression law in order to avoid channel overload and to permit restoration of the signal by the expander.

Superposition effects in accordance with the invention are achieved by various circuit arrangements, the most basic being those which follow directly from the above presentation—that is, particularly those in which the effective result is to feed the inputs to a plurality of elements differentially and to sum the element outputs. For example, if each element has an input terminal, a reference potential (e.g., ground) terminal, and an output terminal, then the input to the first element is the input signal with respect to the reference potential, the input to the second element is the input signal with respect to the output of the first element (e.g., the difference between the input signal and the output of the first element), the input to the third element (if there is a third element) is the input signal with respect to the sum of the outputs of the first and second elements (e.g., the difference between the input signal and the sum of the outputs of the first and second elements), and so on if there are more elements. The outputs of the elements are summed to provide the overall output. This can be implemented in a number of substantially equivalent ways including a circuit topology such as in FIG. 3 in which the inputs and outputs are literally taken as just described.

However, there is a simpler way, shown in FIG. 4, in which the three-terminal network elements are linked together with less complexity and yet achieve the same results as the arrangement of FIG. 3. The input signal is applied to the input terminal of each element. The first element input is with respect to a reference potential (e.g., its second terminal is connected to a reference potential); the second element input is with respect to the output of the first element (e.g., its second terminal is connected to the output terminal of the first element rather than to the reference potential); the third element input (if there is a third element) is with respect to the output of the second element (e.g., its second terminal is connected to the output element of the second element rather than to the reference potential); and so on if there are more elements. The overall output is taken at the output terminal of the last element. This latter arrangement, which may be referred to as a "stack" of elements, is the preferred way in which to practice the invention because of its simplicity. However, other circuit topologies can provide the same or similar results, although with greater complexity and cost of implementation. For example, FIG. 5 shows an another arrangement which is useful in demonstrating the transition from the FIG. 3 topology to the FIG. 4 topology. FIGS. 3, 4 and 5 are equivalent to each other: FIG. 5 is a transition between FIGS. 3 and 4, retaining the summed outputs while removing the second terminals of all but one element from the reference potential.

Although the invention is applicable generally to combinations of elements having various dynamic and passive characteristics, a very useful combination of characteristics in practice and for the purposes of explanation is the superposition of a fixed band dynamic characteristic and a sliding band dynamic characteristic. By applying the teachings of the present invention the advantages of both characteristics can be obtained while avoiding their disadvantages. Thus, if a sliding band characteristic and a fixed band characteristic are superposed in substantially the same frequency range (wide band or a defined band) and level range, the quiescent characteristic of the superposed combination appears the same as the quiescent characteristic of either one taken alone because the two quiescent characteristics are the same. When a dominant signal component appears within their frequency range each characteristic reacts—the fixed band characteristic drops uniformly in level across the frequency range similar to the way it would if acting by itself and the sliding band characteristic slides similarly to the way it would if acting by itself.

However, the two actions are no longer independent: to some extent each acts with reference to the other. When these changes occur the two characteristics, which appeared as one characteristic in the quiescent condition (FIG. 6A), are now revealed: the combined characteristic appears as that of a sliding band characteristic above (or below, depending on whether the sliding band acts upwardly or downwardly in frequency) the frequency of the dominant signal and it appears as a fixed band characteristic below (or above) the frequency of the dominant signal. FIG. 6B shows an example in which the sliding band is above the dominant signal and FIG. 6C shows an example in which the sliding band is below the dominant signal. Two regimes of operation are revealed, divided at the frequency of the dominant signal. Thus, the region which the sliding band characteristic would have left "uncovered" is supplemented by the fixed band characteristic which, in effect, provides a floor or foundation level. In other words, there is a substitution of action in response to the dominant signal component. The result is to obtain the advantages of both fixed band and sliding band arrangements while avoiding their disadvantages. Maximum noise reduction effect and minimum modulation effects are obtained above (or below) the dominant signal where the sliding band characteristic operates while avoiding the loss of noise reduction and the mid-band modulation effect below (or above) the dominant signal by the presence of the fixed band characteristic. Thus, there is no multiplication effect below (or above) the dominant frequency as would occur if the sliding band characteristic were operating alone, while obtaining the advantages of the sliding band characteristic above (or below) the dominant frequency.

An even more adaptive arrangement can be achieved by providing a bandsplitting arrangement in which the high frequency band and low frequency band each comprise superposed fixed band/sliding band characteristics. In the high frequency band the sliding band acts upwardly in frequency while in the low frequency band the sliding band acts downwardly in frequency. In the quiescent condition the characteristics overlap so as to provide a flat overall characteristic. By choosing gentle filter slopes (say, 6 dB/octave) and a common quiescent corner frequency in the middle of the frequency band (say, 800 Hz for an audio system), excellent tracking of a dominant signal by both the high and low frequency bands throughout a substantial portion of the band under processing is possible. The quiescent response of such an arrangement, in which the high frequency and low frequency bands have the same low level gain, is flat as shown in FIG. 7A.

FIG. 7B shows the tracking of a single high-level dominant signal at various frequencies for a multi-stage compressor arrangement such as described in greater detail below in connection with the description of FIGS. 22, 23, and 24 (in each case, without the respective spectral skewing and antisaturation networks). Because the compressor arrangements of FIGS. 22, 23, and 24 employ two low-frequency stages having a low level gain of 16 dB and three high-frequency stages having a low level gain of 24 dB, the quiescent response, as shown in FIG. 7B, is 16 dB at low frequencies, rising to 24 dB at high frequencies. In the example of FIG. 7B, for each high-level (0 dB relative to a reference level which is taken to be about 20 dB below the maximum level in the system) tone (a dominant signal) at various frequencies (100 Hz, 200 Hz, 400 Hz, 800 Hz, 1.6 kHz, 3 kHz, and 6 kHz), a low-level (−60 dB to −70 dB) is swept through the spectrum to show the overall response in the presence of the dominant signal. A sliding band response appears above and below the dominant signal. The presence of two dominant signals results in a fixed band response between the dominant signals and sliding band response at frequencies above and below their frequencies where maximum noise reduction is most critical (FIG. 7C; in FIG. 7C as in FIG. 7A, the high frequency and low frequency bands have the same low level gain).

The good tracking behavior exhibited in FIGS. 7B and 7C is made possible by the use of both fixed and sliding band characteristics in each of the two bands of the bandsplitting arrangement. For example, in FIG. 7C there would clearly be a serious deficiency of non-dominant signals (poor noise reduction effect) in the region between the two major dominant signals if the two fixed bands were not used. If desired, a mid-band (a pass band, 400 Hz to 1.6 kHz, for example), overlapping in part the high and low frequency bands, could also be incorporated to improve the noise reduction in the mid-frequency range when both extremely low frequency and extremely high frequency dominant signals are simultaneously present. The output of the mid-band element could be fed to the bottom of both high and low frequency stacks. This latter refinement does not appear to be necessary in practical audio noise reduction circuits.

Note that action substitution makes good signal tracking possible. Consider the use of conventional high slope (12 dB/octave or more) high and low pass variable filters. Firstly, the filter outputs would not combine to a flat characteristic in the quiescent condition; using a similar attenuation shape for both the low and high frequencies, this is possible only with single pole filters (FIG. 7A). Secondly, as soon as one or both filters slide, a non-dominant signal deficiency would appear (poor noise reduction).

In the present invention the filters defining the stage boundaries are single pole filters for optimal low-level response. In the presence of signals, additional single pole sliding band shelving filters are used, whereby a quasi-two-pole result is achieved without the excessive phase shift (phase reversal) inherent in two-pole filters. The intervention of the fixed band, via action substitution, further tailors the response. The use of several staggered-level stages then provides a further quasi-multi-pole effect to compound the resultant responses—i.e., the effective network steepness or ability of the system to discriminate between dominant and non-dominant signal components.

Regarding dynamic recovery characteristics of the overall compressor or expander, action substitution can further contribute to improved performance. A fixed band will have a recovery time that is essentially independent of frequency, at least in the pass band. A sliding band circuit has a fast recovery time for non-dominant signals at the pass band end of the spectrum, and a slow recovery time for non-dominant signals at the stop band end of the spectrum. The choice of control circuit recovery times is therefore a matter of compromise between this recovery time situation and the amount of steady state and modulation distortion obtained. The compromise is much easier, however, with the use of the action substitution technique. In particular, the fixed band provides a definite and rapid recovery time for the overall system, so that the sliding band can employ longer time constants than would otherwise be desirable. This results both in low modulation distortion and a fast recovery time.

BRIEF DESCRIPTION OF THE DRAWINGS

FIG. 1 is an idealized compressor characteristic response curve illustrating the prior art sliding band multiplication effect.

FIG. 2 is an idealized compressor characteristic response curve illustrating the prior art fixed band limiting effect.

FIG. 3 is a block diagram illustrating generally a circuit topology useful in practicing the invention.

FIG. 4 is a block diagram illustrating generally a circuit topology equivalent to the topology of FIG. 3 and preferred for practicing the invention.

FIG. 5 is a block diagram of a further circuit topology and one which is useful in demonstrating the transition from the topology of FIG. 3 to that of FIG. 4.

FIG. 6A is an idealized compressor characteristic response curve showing the quiescent response of fixed band and sliding band elements superposed in accordance with the invention.

FIG. 6B is an idealized compressor characteristic response curve showing the response slightly above their thresholds of fixed band and sliding band elements superposed in accordance with the invention, the sliding band acting upward in frequency.

FIG. 6C is an idealized compressor characteristic response curve showing the response slightly above their thresholds of fixed band and sliding band elements superposed in accordance with the invention, the sliding band acting downward in frequency.

FIG. 7A is an idealized compressor characteristic response curve showing the quiescent response of high frequency and low frequency circuits, each having fixed band and sliding band elements superposed in accordance with the invention, the circuits having a common corner frequency of 800 Hz.

FIG. 7B is an idealized compressor characteristic response curve showing the tracking response of the same high frequency and low frequency circuits referred to in connection with FIG. 7A in the presence of a dominant signal at various frequencies.

FIG. 7C is an idealized compressor characteristic response curve showing the response of the same high frequency and low frequency circuits referred to in connection with FIG. 7A in the presence of two dominant signals.

FIG. 8 is a schematic circuit diagram useful in explaining the basic operation of the preferred embodiment of the invention.

FIG. 9 is a block diagram showing an equivalent arrangement for practicing the invention.

FIG. 10 is a block diagram illustrating a modified arrangement for practicing the invention.

FIG. 11 is a partially schematic block diagram demonstrating the way in which multiple characteristic actions may be linked together in accordance with the invention.

FIG. 12A is an idealized compressor characteristic response curve useful in understanding the operation of the arrangement of FIG. 11.

FIG. 12B is a further idealized compressor characteristic response curve useful in understanding the operation of the arrangement of FIG. 11.

FIG. 13 is a partially schematic block diagram showing an embodiment of the invention in which a fixed band element and a sliding band element are stacked together, each having separate control circuits, with an optional cross-coupling from the control circuit of one element to another element.

FIG. 14 is a modification of the embodiment of FIG. 13 in which a filter is included in the coupling provided from the control circuit of one element to another element.

FIG. 15 is a modification of the embodiment of FIG. 13 in which a common control circuit is provided for the two elements.

FIG. 16A is modification of the embodiment of FIG. 14 in which the fixed band element is parked at a level other than its normal quiescent level.

FIG. 16B is further modification of the embodiment of FIG. 14 in which the fixed band element is parked at a level other than its normal quiescent level and in which a type of cross-coupling is provided such that the corner frequency of the sliding band element is parked at a frequency other than its normal quiescent frequency. The figure also shows another aspect of the invention, a shunt for the gyrator inductor element.

FIG. 17A is an idealized compressor characteristic response curve showing the quiescent response of a circuit of the type shown in the arrangements of FIGS. 13 through 16.

FIG. 17B is an idealized compressor characteristic response curve showing the response slightly above the thresholds of the elements of a circuit of the type shown in the arrangements of FIGS. 13 through 16.

FIG. 17C is an idealized compressor characteristic response curve showing the response at an even greater level above the thresholds of the elements of a circuit of the type shown in the arrangements of FIGS. 13 through 16.

FIG. 18 is a partially schematic block diagram of an embodiment of a high frequency fixed band/sliding band stage according to the invention.

FIG. 19 is a partially schematic block diagram of an embodiment of a low frequency fixed band/sliding band stage according to the invention.

FIG. 20 is a block diagram showing a Type I dual path arrangement employing high frequency and low frequency stages of the type described in connection with FIGS. 18 and 19.

FIG. 21 is a block diagram showing a Type II dual path arrangement employing high frequency and low frequency stages of the type described in connection with FIGS. 18 and 19.

FIG. 22 is a block diagram of a compander system having series staggered stages employing high frequency and low frequency circuits of the type described in connection with FIGS. 18 and 19.

FIG. 23 is a partially schematic block diagram of a switchable compressor/expander employing high frequency and low frequency circuits of the type described in connection with FIGS. 18 and 19 and illustrating the use of a secondary main path in order to simplify switching.

FIG. 24 is a partially schematic block diagram of a switchable compressor/expander employing high frequency and low frequency circuits of the type described in connection with FIGS. 18 and 19 and illustrating the use of an inverting amplifier in parallel with the compressor portion of the arrangment of FIG. 22 in order to simplify switching.

FIG. 25 is a block diagram of a prior art switching arrangement useful in explaining the operation of FIG. 24.

FIG. 26 is a characteristic compression response curve relating to the arrangements of FIGS. 22, 23, and 24.

DETAILED DESCRIPTION OF THE INVENTION

In order to better understand the operation of the basic topology of the preferred emdodiment of the present invention it is useful first to simplify the arrangement so that there are only two elements, each of which is a wideband (frequency independent) resistive attenuator as in FIG. 8. The maximum possible action of each element is to provide a gain of unity. $R_1$ and $R_2$ comprise the first attenuator ($R_2$ being variable), a three-terminal network, receiving $V_{in}$ at its input, having its second terminal connected to ground and its output applied to the second terminal of the other attenuator via a unity-gain buffer B. The second attenuator, another three-terminal network, receivin $V_{in}$ at its input and providing the overall combination output at its output, is comprised by $R_3$ and $R_4$, the latter being variable.

First, assume that $R_2$ and $R_4$ are very large; then neither network provides any attenuation (viewed from their common inputs to $R_1$ and $R_3$) and $V_{in}$ is present at nodes $n_1$ and $n_2$ (the junctions of $R_1/R_2$ and $R_3/R_4$, respectively). It follows that $V_{out}$ must equal $V_{in}$ because the potential across $R_4$ is zero and no current flows in $R_4$. It is known that in a passive three terminal network, if there is no internal connection to ground, the voltage transfer function of one input to the output is the complement of the other input to the output (e.g., if the transfer function with respect to one input is "t", the transfer function with respect to the other output is "1−t", its complement). Thus, the transfer function of the top network is 1 with respect to the signal applied to $R_3$ and its complementary transfer function with respect to the signal applied to $R_4$ is zero. The sum of the voltages resulting from the two transfer functions is therefore $V_{in}$.

Next, assume that $R_2$ is very large but that $R_4$ is very small. Thus the lower element has no attenuation and the upper element has maximum attenuation (viewed from their common inputs to $R_1$ and $R_3$). Thus, $V_{in}$ is present at node $n_1$ and must also be present at node $n_2$ because $R_4$ is very small. There is no contribution from the input via $R_3$ because the attenuation of the upper network is maximum. Thus the output is $V_{in}$. Or, viewed from the standpoint of transfer functions, the transfer function of the top network is zero with respect to the signal applied to $R_3$ and its complementary transfer function with respect to the signal applied to $R_4$ is one. The sum of the voltages resulting from the two transfer function is therefore $V_{in}$.

It is useful to demonstrate that for this general case that the reverse positioning of the elements is immaterial to the result. Thus assume that $R_4$ is very large but that $R_2$ is very small. Thus the upper element has no attenuation and the lower element has maximum attenuation (viewed from their common inputs to $R_1$ and $R_3$). Therefore, the voltage at node $n_2$ is $V_{in}$ and must also be the output voltage $V_{out}$ because $R_4$ is large and no current flows through it. Considering transfer functions, the transfer function of the top network is one with respect to the signal applied to $R_3$ and its complementary transfer function with respect to the signal applied to $R_4$ is zero. The sum of the voltages resulting from the two transfer function is therefor $V_{in}$.

Thus, if both of the elements have no attenuation (as viewed from the inputs to $R_1$ and $R_3$), then the output is $V_{in}$. It can be observed from the above that the output is also $V_{in}$ if either of the elements has no attenuation (as viewed from the inputs to $R_1$ and $R_3$) regardless of the attenuation, if any, of the other element.

This analysis extends on a steady-state basis to the more complex cases as described hereinafter where attenuation is provided using field effect transistors (FETs) as the variable resistance elements and the attenuation is effective only in a portion of the frequency band of the input signal.

Several general observations can be drawn regarding the operation of the present invention. These observations are believed to be valid not only for the simple circuit arrangements discussed above, but also under most signal conditions in more complex circuit arrangements contemplated by the invention. First, the highest transmission of any element is the output. Second, the characteristics of the elements do not produce an output characteristic any greater in magnitude than the greatest magnitude of either element (e.g., the characteristics cannot provide too much effect) and third, the characteristic of one element is hidden by that of another, depending on which is greater in magnitude. While it is possible to achieve such results using other circuit arrangements, the circuit arrangements according to the present invention are preferred because they are simple to implement and they provide the desired results.

In practice, the first observation is particularly useful in the case where all but one element is knocked out in response to signal conditions, leaving only one element to provide compression or expansion. In that situation, the remaining element provides its full effect (which may be less than its maximum possible effect, depending on how it is affected by the dominant signal). An example of this would be an arrangement of a sliding band element and a fixed band element operating in the same frequency range (having responses as, for example, in FIGS. 6B or 6C). A dominant signal could cause the sliding band element to slide upward (or downward) so as to totally knock out its effect at or near the frequency of the dominant signal. However, the fixed band element would remain fully effective (although perhaps less than its maximum effect as a result of the presence of the dominant signal). This is the case at frequencies well below the dominant signal in FIG. 6B and well above the dominant signal in FIG. 6C. However, it will be noted that in the crossover region (at the frequency of the dominant signal in FIGS. 6B and 6C), where the overall response changes from the fixed band to the sliding band response, there is a slight augmentation in the response such that the overall response is somewhat greater than the response of either element. This augmentation effect occurs in general where the operating regimes of characteristics operating at less than their maximum effect crossover. The effect is reflected in the presence of the product term of Equation 1.

The second observation is fundamental to the "defining umbrella" effect of the invention. That is, the maximum possible effect of the combination of characteristics is no greater than the greatest effect of each characteristic. However, when characteristics operate at less than their maximum effect, the above noted augmentation of responses occurs in crossover regions.

The third observation is also basic to the invention, permitting the substitution of characteristic actions in response to changes in signal conditions.

The invention thus provides a circuit for modifying the dynamic range of input signal components within a frequency band, in which a plurality of circuit elements are interconnected, each having its own passive or dynamic characteristic action, at least one having a dynamic characteristic action, the characteristic actions operating at least partially within substantially the same frequency and level region, the circuit elements being interconnected such that for some level and spectral content of the input signal components the characteristic action of one circuit element substitutes for the characteristic action of another circuit element in at least a portion of the frequency band. The interconnection of the circuit elements provides for characteristic action substitution by superposition of characteristics wherein an over circuit characteristic action is derived from the individual characteristic actions of the plurality of circuit elements such that for any combination of level and spectral content of the input signal components an individual characteristic action defines the overall frequency band or individual characteristic actions each define portions of the overall frequency band, the individual characteristic action or characteristic actions which define all or a portion of the overall frequency band suppressing the effect of any other individual characteristic action or characteristic actions having less effect within the same frequency range. The overall characteristic action for any combination of level and spectral content of input signal components has substantially no greater an effect at any frequency than any individual characteristic operable at that frequency.

It can be shown that the overall voltage transfer function of the combination of two elements interconnected as described is of the form $$V_{out} = V_{in}[t_1(s) + t_2(s) - t_1(s)t_2(s)] \qquad \text{Eqn. 1)},$$

where $V_{in}$ is the applied voltage, $V_{out}$ is the output voltage, $t_1(s)$ and $t_2(s)$ are the transfer functions of each element.

This equation confirms the operation as described above. Namely, the overall output is the sum of the transfer functions but subtracted therefrom is their product. In other words, to the extent that the transfer functions may overlap, a factor is subtracted from the sum of the transfer functions. The presence of this third term is essential to the action substitution and superposition effects of the invention.

In terms of the fixed band/sliding band example, the fixed band and sliding band responses maintain their respective characteristics where they do not overlap; within the area of overlapping (e.g., their crossover region of effectiveness) they affect each other so that the overall result in the area of overlap is substantially no greater than either of the elements acting alone.

The same basic principles apply to larger numbers of elements connected generally in the same manner as described, as set forth in connection with FIGS. 3 through 5 and 8 through 11, although the transfer function equations become more complex. Larger combinations of elements can be analyzed by an iterative process, extrapolating from the above two element analysis: for example, for a combination of three elements first consider the first two elements, applying their output as though it were the output of a single element in a two element combination. It can be shown that the overall transfer function of the combination of three elements interconnected in the manner described is of the form $$V_{out} = V_{in}[t_1(s) + t_2(s) + t_3(s) - t_1(s)t_2(s) - t_1(s)t_3(s) - \qquad \text{(Eqn. 2)}$$

$$t_2(s)t_3(s) + t_1(s)t_2(s)t_3(s)],$$

where $V_{in}$ is the applied voltage, $V_{out}$ is the output voltage, $t_1(s)$, $t_2(s)$ and $t_3(s)$ are the transfer functions of each element. The same general pattern is present as with two elements with the exception of the presence of a further term, which is a product of the three transfer functions.

As a practical matter, the circuits may include both gains and attenuations. The unity gain buffer between elements is symbolic and can be omitted if the impedances are suitable, provided that loading effects are avoided. In the simplest case of the FIG. 8 arrangement the buffer B might be omitted and a direct connection made between node $n_1$ and variable resistor $R_4$ if the impedances are appropriate. While the resulting circuit may have interactions between the elements that may not occur when a buffer is used, the circuit performance may be acceptable for certain applications.

The above equation number 1 describing the circuit of FIG. 8 suggests an equivalent arrangement shown in block diagram form in FIG. 9. The input signal is applied to three paths whose outputs are summed. The first path contains the transfer function $t_1(s)$ in block 2, the second path the transfer function $t_2(s)$ in block 4, and the third path the series combination of transfer functions $t_1(s)$ and $t_2(s)$, shown in blocks 6 and 8, respectively. The product of the transfer functions in the third path is inverted by inverter 10 so as to subtract when summed in block 12. While such a configuration would be impractical because of its additional complexity, it nevertheless illustrates that the same results can be achieved using alternative circuit arrangements. Equation 2 suggests a similar modified configuration for three elements. The teachings of the present invention could also be practiced by a special purpose or general purpose digital computer controlled by custom software programming which implements an algorithm practicing the action substitution and superposition principles of the invention.

FIG. 3 illustrates the equivalent arrangement described in the summary of the invention. Four three-terminal elements 14, 16, 18 and 20 are shown having transfer functions $t_1(s)$, $t_2(s)$, $t_3(s)$, and $t_4(s)$, respectively. Each element has its second terminal connected to ground and has its third terminal output connected to a summing means 22. The input signal $V_{in}$ is applied to the first terminal of element 14 with respect to ground and to a first summing means 24. The input to element 16 is the output of element 14 subtracted by summing means 24 from the input $V_{in}$. The input to element 18 is the output of element 16 subtracted by summing means 26 from the input to element 16. The input to element 20 is the output of element 18 subtracted by summing means 28 from the input to element 18.

FIG. 4, also referred to in the summary of the invention, illustrates more generally the preferred embodiment discussed in connection with FIG. 8. In the arrangement of FIG. 4 four three-terminal elements 30, 32, 34, and 36 are shown having transfer functions $t_1(s)$, $t_2(s)$, $t_3(s)$, and $t_4(s)$, respectively. The input signal $V_{in}$ is applied to the first terminal of elements 30, 32, 34, and 36 with respect to the reference potential (shown as ground). Only the second terminal of element 30 is connected to a reference potential. The input to the second terminal of element 32 is the output of element 30 (from its third terminal). The input to the second terminal of element 34 is the output of element 32 (from its third terminal). The input to the second terminal of element 36 is the output of element 18 (from its third terminal). The overall output is taken between the third terminal of element 36 and the reference potential. This general arrangement can be described as "stacking" of elements and is believed to be the simplest and most effective way in which to implement the invention.

FIG. 5, the transition between the arrangements of FIGS. 3 and 4 referred to in the summary of the invention, illustrates another possible circuit topology that is equivalent. Four elements are used solely for the purposes of illustration in FIGS. 3, 4, and 5. Superposition effects in accordance with the teachings of this invention can be achieved using two or more elements, at least one being dynamic, as is explained further below. In the arrangement of FIG. 5 four three-terminal elements 38, 40, 42, and 44 are shown having transfer functions $t_1(s)$, $t_2(s)$, $t_3(s)$, and $t_4(s)$, respectively. The input signal $V_{in}$ is applied to the first terminal of elements 38, 40, 42, and 44 with respect to the reference potential (shown as ground). Only the second terminal of element 38 is connected to the reference potential. The input to the second terminal of element 40 is the output of element 38 (from its third terminal). The input to the second terminal of element 42 is the summation (from summing means 46) of the output of element 38 and the the output of element 38 subtracted from the output of element 40 (derived in summing means 48). The input to the second terminal of element 44 is the summation (from summing means 50) of the output of summing means 46 and the output of summing means 46 subtracted from the output of element 42 (derived in summing means 52). The overall output is taken from summming means 54 which combines the output from element 38, summing means 48, summing means 52, and summing means 56, which subtracts the output of summing means 50 from the output of element 44.

The stacking arrangement of FIG. 4 can be further modified by introducing branching such as shown in FIG. 10. Such arrangements may be useful in creating more complex superposition effects than are possible with a direct or straight linkage such as in FIG. 4. In the FIG. 10 modification the second "level" in the stack has two elements rather than one. Thus, the input $V_{in}$ is applied to the first terminal of blocks 58, 60, 62 and 66 having respective transfer functions $t_1(s)$, $t_2(s)$, $t_3(s)$ and $t_4(s)$. The second terminal of the three-terminal network of block 58 is connected to a reference potential (e.g., ground) and its third terminal feeds the second terminals of blocks 60 and 62. The outputs from the third terminals of blocks 60 and 62 are added in summing means 64 and applied to the second terminal of block 66. The overall output is taken from the third terminal of block 66. Other branching arrangements are possible: the arrangement of FIG. 10 is only one example of the manner in which elements may be configured in accordance with the invention.

Although not shown in FIGS. 3, 4, 5, and 10, the linkages between elements may be buffered or unbuffered, but preferably are buffered, as discussed above. In addition, while the general arrangements thus far shown employ three-terminal networks, equivalent circuit arrangements are possible based on these teachings in which some or all of the elements are three or four terminal networks each of which "floats" or is connected to a reference potential. For example, transformers and various isolation techniques could be employed to achieve the basic "differential feed, summed output" arrangement inherent in FIGS. 3 through 5 and 8 through 10.

With respect to any combination of elements in accordance with the teachings of the invention, in order to provide an overall compressor or expander action, at least one element must have a transfer function that is a compressor or expander function. All of the elements which are active (e.g., have characteristics that vary dynamically in response to signal conditions) generally must act in the same sense (e.g., provide compressor or expander action). One or more elements may have a passive characteristic (e.g., the characteristic does not vary dynamically in response to signal conditions). It may be useful to have more than one passive element provided that the active element has a dynamic characteristic such that as it varies different aspects of the passive characteristics are revealed.

Although arrangements of elements in accordance with the invention can function as stand alone compressors and expanders, it is preferred to employ them in one or more side paths of dual path compressor and expander arrangements of the type generally described in U.S. Pat. Nos. 3,846,719, 3,903,485, 4,490,691; and 28,426, each of which is incorporated herein by reference.

Active elements each preferably have their variable conditions controlled by their own control circuits, although for certain purposes it may be acceptable to control more than one active element with a single control circuit. Where individual control circuits are employed, although it is possible for these control circuits to operate independently only in response to the signals in each element, in practice the overall circuit performance may be improved by applying additional signals to the control circuits, as described further below. It will be apparent that the simple analysis based on steady-state attenuator elements may not fully apply in practice under dynamic conditions where the elements have control circuits and where those control circuits can have interconnections to other elements and portions of the overall system environment.

It will also be appreciated that some active elements may have thresholds at which dynamic action will begin in response to a dominant signal. In designing a stack of elements, the selection of different threshold levels among the active elements may be advantageous so as to influence the sequence in which the characteristics of the various elements emerge in response to various dominant signal conditions. In general, however, in order to achieve superposition effects, the active or dynamic elements must be active in generally the same level range. That is, the range of input signal levels that cause dynamic action should be substantially the same, subject to variations of a few decibels.

The arrangement of FIG. 11 is useful in illustrating the way in which multiple elements with various characteristics may be usefully combined and in describing the setting of relative thresholds among elements in a stack. For simplicity and ease of understanding only the principal components necessary to illustrate the concept are shown in this Figure (and the following FIGS. 13 through 16). The arrangement may form the noise reduction side path in a dual path compressor or expander or, alternatively, it may form a stand alone compressor. This arrangement is but one example of the way in which multiple elements with different characteristics can be combined. Another useful combination of elements is to provide for elements with upward acting and downward acting sliding band characteristics within the same frequency band.

A five element stack is shown in FIG. 11 having a wideband attenuator element 68, a fixed band attenuator element 70, a sliding band element 72, a first spot frequency attenuator element 74 and a second spot frequency attenuator element 76. Each element receives the input signal. High pass filters 78 and 80, each having an 800 Hz corner frequency, form a part of the transfer functions of elements 70 and 72. Band pass filters 82 and 84, centered at 960 Hz (an audio interference frequency related to head rotation in quadruplex videotape recorders) and at 15.75 kHz (an audio interference frequency at the horizontal sweep frequency in 525 line television systems) form a part of the transfer functions of elements 74 and 76, respectively. Each element has its own independent control circuit 86, 88, 90, 92, and 94, essentially a rectifier and smoothing circuit including an amplifier which can have frequency weighted or wideband gain, as may be necessary. Preferably, each control circuit responds only to the output of its respective element; that is, the control signal is derived differentially using combining means 89, 91, 93, and 95 (note subtractive feed from bottom of each element). The control circuits control the variable resistance elements 96, 98, 100, 102, and 104, which, in practice may be FETs, the control voltage being applied to their gate input. The fixed band attenuator elements 68, 70, 74 and 76 have series resistors (106, 108, 110, and 112, respectively) to form a variable voltage divider in conjunction with the FETs. The sliding band element 72 has a series capacitor 114 to form a variable high pass filter in conjunction with the FET. In the manner of the preferred stack arrangement of FIG. 4, element 68 is driven with respect to a reference, shown as ground and each of the other elements is driven through a buffer (unity gain buffers 116, 118, 120, and 122) with respect to the output of the element below it. Note that each filter, if included, also has its reference terminal connected to the output of the element below it. Each element has a threshold level such that when the signal level rises in the element and reaches that level a change in the variable element begins. Each element is assumed to provide a maximum of 10 dB of dynamic action. The overall output of the arrangement is from the output of the top element through a unity gain buffer 124.

In the quiescent state, the defining envelope of the arrangement of FIG. 11 is a total dynamic action of 10 dB, wideband. As signal components appear, the characteristics of the various elements emerge in response to the frequencies and levels of the components. The sequence in which the characteristics of elements emerge in response to those signal components will depend on the operating frequency range of the respective elements and their relative threshold levels.

Consider first two examples. If a 200 Hz tone appears, starting at a sub-threshold level and gradually rising in level, the wideband element is eventually defeated, but the others remain fully effective. Thus the overall characteristic, shown in FIG. 12A, is that of the 800 Hz fixed and sliding bands, which are coincident and partly hide the two spot frequency characteristics: the tip of the 960 Hz spot frequency characteristic appears. If a 2 kHz tone also appears, rising in level, the 800 Hz fixed band is affected and is eventually defeated also, but the sliding band and the two discrete frequency bands continue to operate. The overall characteristic, shown in FIG. 12B, is therefore that of the 960 Hz spot frequency characteristic and the sliding band characteristic, the high pass filter of the sliding band having moved upwardly in response to the 2 kHz tone. The sliding band characteristic hides the 15.75 kHz spot frequency characteristic.

In the arrangement of FIG. 11, each element has its own control circuit which operates entirely in response to signals within the respective element as a result of the differential derivation of the control signals. Elements may have each have a totally independent control circuit, with or without differential derivation, and various cross connections are possible. The cross connections illustrated in FIGS. 13 and 14 are useful in permitting different thresholds to be set in the elements while retaining adequate control circuit gain in the sliding band element at frequency extremes. Another type of cross connection, referred to as "parking" is described below in connection with FIGS. 16A and 16B.

Referring to FIG. 13, a fixed band element 126, a wideband attenuator, is shown stacked with a sliding band element 128, a sliding shelf acting upwardly in frequency and having a wideband quiescent characteristic: substitution of an inductive element instead of the capacitor would result in a sliding shelf acting downwardly in frequency. As a practical matter, a gyrator circuit would be used to simulate an inductor. The fixed band element has a series resistor 130 and a shunt FET 132, connected to a reference potential, which form a variable attenuator as the resistance of the source-drain path of the FET is controlled in response to a control voltage applied to its gate. The output of the fixed band element is applied through a buffer amplifier 134 to a rectifier and smoothing circuit 136. The sliding band element 128 includes parallel capacitor 138 and resistor 140 shunted by FET 142 which is connected to the output of the fixed band element, at the output of buffer 134. The output of the sliding band element is applied to a buffer amplifier 144, an optional combining means 150, and a rectifier and smoothing circuit 146 which provides a control voltage to the FET 142. The output of the combination of elements is taken from buffer amplifier 144.

As noted in connection with the arrangement of FIG. 11, it is possible to use the output of one element in a stack to buck the output of the next element in generating the control voltage of that next element. This is shown not only in FIG. 11 but also in FIG. 13 where the output of the sliding band element from buffer 134 is subtracted from the output of the fixed band element from buffer 144 in the combining means 150. The bucking signal from the fixed band element can be treated so as to be more or less than the sliding band element output (by amplification or attenuation) and the sense of the bucking signal can be inverted so that as the fixed band element output increases the bucking signal decreases. These principles apply generally to successive active elements in any arrangement according to the invention.

A further alternative is shown in FIG. 14 in which the bucking signal from the fixed band element is first conditioned by a filter 152 located in the control circuit loop for the fixed band element. Typically, the filter would be a high pass or low pass filter located within the operating band of the overall circuit. An unfiltered bucking signal, shown as a dashed line, may simultaneously be applied in the manner of the alternative version of FIG. 13 (e.g., with optional combining means 150). The filtered bucking signal can be treated as mentioned in connection with the unfiltered bucking signal of FIG. 13.

In a further control circuit coupling variation, it is possible to feed the rectified signal in the control circuit of one element into the DC portion of the control circuit of another element. For example, in FIG. 13, the summing means 150 would be located between the output of rectifier and smoothing circuit 146 and the gate of FET 142, and the bucking signal from element 126 would be taken from the output of rectifier and smoothing circuit 136. This alternative is advantageous where the signal phase relations may not be correct for AC combining/bucking as in the method discussed above. However, a disadvantage is that it is not possible to apply selective filtering of the coupled component, as in FIG. 14.

In some applications it may be possible to eliminate one control circuit and use a common control circuit for two elements as is shown in FIG. 15, although the use of individual control circuits for each element is preferred to produce a more conformal effect. (The same reference numerals are used for common components in FIGS. 13 through 15.) In FIG. 15, the output of the fixed band control circuit from the rectifier and smoothing circuit 136 is applied through a buffer 148 in order also to control the sliding band FET 142.

FIG. 16A shows a modification of FIG. 14 in which an additional feature referred to as "parking" is incorporated in the circuit. The concept of parking is based on the observation that it is often advantageous to pre-set or "park" a response characteristic at some level and/or frequency other than its quiescent level and/or frequency when the element is below its threshold. In the case of the fixed band element, the fixed band control circuit is parked at a level just below its threshold so that the circuit reacts more quickly in response to changes in the input signal. A detector 153 senses the fixed band control signal, develops an appropriate signal and applies it to summing means 155 where it is added to, or takes over from, the control signal to provide the fixed band parking signal. In operation, the parking signal level preferably is set just below the fixed band threshold. Above the threshold, the fixed band control circuit takes over to the exclusion of the parking detector. Thus, the detector 153 is required to sense the fixed band control signal and to provide, only when the fixed band element is below its threshold, the correct signal level for parking the fixed band control circuit at the desired level. A detector providing these functions may be implemented in various ways: one suitable arrangement is to sense the fixed band control voltage with a "perfect diode" circuit. Such circuits are well known and employ an operational amplifier biased so that the circuit switches its output from positive to negative when the signal being sensed rises to the bias voltage. The perfect diode circuit output, suitably adjusted in level as may be necessary, acts as a maximum selector circuit which takes over from the fixed band control signal to provide the desired parking signal.

FIG. 16B shows generally another arrangement of stacked fixed band and sliding band elements employing parking. In this case the sliding band element 129 has an inductor 139 (simulated by a gyrator circuit in practical embodiments) so that the sliding band circuit operates downwardly. In the arrangement of FIG. 16B, parking is provided not only in the fixed band circuit but also in the sliding band circuit. As applied to the sliding band circuit, the concept of parking is based on the observation that as long as the fixed band umbrella characteristic is present, then it is possible to pre-slide the sliding band ("park" it) to the frequency region where the action is likely to be when a signal is applied. This improves response time and reduces modulation distortion. In its quiescent state the downwardly acting sliding band would normally be in its wideband state (in the absence of any parking circuit)—that is, the high frequency cutoff would be infinity, i.e., well into the low frequency stop-band if the circuit were employed in an arrangement such as described below in connection with FIG. 19. Referring again to FIG. 16B, when a signal appears the band slides down to attenuate the dominant signal, which with speech and music very likely will be in the range 100 Hz–1 kHz. Therefore, it is useful to park the low frequency sliding band at a cutoff frequency of about 400 Hz, just into the low frequency pass-band of the FIG. 19 arrangement. Referring again to FIG. 16B, the parking influence is removed as soon as the signal rises above the fixed band threshold as this marks the imminent reduction or disappearance of the fixed band umbrella. Detector 153 senses the fixed band control signal in relation to a reference voltage and develops the parking signal which is applied to the sliding band FET 142 via combining means/maximum selector 151. After the signal has risen above the fixed band threshold, if the applied frequency is lower than 400 Hz, the sliding band control circuit takes over and slides the band down further. If the frequency is above 400 Hz, the sliding band control circuit still takes over but allows the cutoff frequency to slide up. The detector 153 is required to sense the fixed band control signal and to provide, only when the fixed band element is below its threshold, the correct signal level for parking the sliding band circuit at the desired frequency. The detector described in connection with the arrangement of FIG. 16A is also suitable for the arrangement of FIG. 16B.

While sliding band parking arrangements can be used in connection with high frequency sliding band circuits as well, the advantages are less because the likely applied signal frequencies are in the high frequency stop band frequency range (referring to arrangements such as in FIGS. 19 and 20), which is already the right way around, in contrast with the low frequency situation.

FIG. 16B shows an additional feature, related to the parking circuits described above, for reducing noise generated by the gyrator simulated inductance 139. A shunt shown as switch 157 is connected across the inductor 139. The switch is controlled by the signal from detector 153. Below the thresholds of the fixed band and sliding band circuits, as sensed by detector 153, there is no need for the sliding band circuit 129 and the inductor 139 to be active. Thus, the gyrator simulated inductance is shorted out by the shunt when the circuits are below their threshold. In a practical circuit, the shunt can be implemented using an FET, the signal from detector 153 being applied to the FET gate. Alternatively, the shunt could be located across any input point to an appropriate output point, the two points having the same signal levels. The use of a shunt to eliminate noise in an active element could be used in any bi-linear or uni-linear compressor or expander circuits because in such circuits there is a range of input signal levels in which the circuit provides no dynamic action. Such a shunt is not necessarily related to parking circuits. In the arrangement of FIG. 16B the parking signal derived from detector 153 merely happens to be suitable for control of the shunt.

The parking and the gyrator shunt features of the embodiments of FIGS. 16A and 16B need not be employed in the context of the FIG. 14 arrangement. For example, the use of a filter 152 is not essential. The parking feature could be applied to a general arrangement such as that of FIG. 11.

The cross coupling arrangements of FIGS. 13 through 16B thus provide considerable flexibility for the circuit designer in determining the manner in which the thresholds of the two elements will interact.

In principle, where the stacked elements each have separate and independent control circuits with full differential control, such as in the arrangement of FIG. 13, the order of the elements in the stack is immaterial: the same results should be obtained with the elements arranged in any order. However, where there is no cross coupling in the control circuitry, or a cross coupling that provides only a partial differential control (as in FIG. 14 when the only bucking signal is from filter 152), the order in which the elements are stacked may affect the overall result.

In order to understand the operation of a two element stack made up of fixed band and sliding band elements (such as in FIGS. 13 through 16), assume that a fixed single pole high pass filter with a corner frequency of 800 Hz, for example, is placed in series to the inputs to the two elements and that the effective threshold of the fixed band element is −62 dB and that of the sliding band element is −66 dB. Each element is assumed to provide a maximum of 10 dB of attenuation. If, for example, a 12 kHz signal is applied at a level of −66 dB, the corner frequency of the sliding band characteristic begins to slide but nothing happens to the overall characteristic envelope because the fixed band is still inactive and supports the envelope. The altered sliding band characteristic is hidden. This situation, shown in FIG. 17A, which has the same envelope as the quiescent condition, but showing the altered sliding band characteristic in phantom, continues until the signal reaches the −62 dB threshold of the fixed band element. As the signal rises above the fixed band threshold (by a few dB), the fixed band begins to attenuate revealing the top of the sliding band characteristic, which continues to slide upward as the signal level rises. This situation is shown in FIG. 17B. As the signal level increases several more dB above the fixed band threshold, the fixed band continues to attenuate and the sliding band continues to move upward as shown in FIG. 17C.

As discussed in U.S. Pat. No. 28,426, in order to obtain full attenuation of the sliding band FET, it is necessary to have a sufficiently high gain in the control signal loop at high levels. The solution set forth in that patent is to provide high frequency weighted amplification in the loop. However, a drawback to that approach is that the loop gain is too high at lower levels (thus causing the band to slide farther than necessary) and it is also difficult to maintain a sufficiently high sliding band threshold.

By employing the cross coupling techniques described in connection with FIGS. 13 and 14 it is possible to achieve the desired sliding band threshold with the desired loop gains at high and low signal level conditions. If the arrangement of FIG. 13 with the optional combining means 150 is used (i.e., full bucking effect), then below the fixed band threshold there would be no control signal drive at all to the sliding band FET and under very high level conditions when the fixed band is defeated (e.g., full attenuation), no further bucking is provided and full gain is provided in the sliding band control signal loop.

In practice, the full bucking approach provides more bucking effect than is necessary and improved performance is achieved if the bucking action is allowed to be less. For example, the effective high frequency gain of the sliding band control signal loop may be reduced by about 5 dB as long as the fixed band is not attenuated and then as it attenuates the bucking action is decreased until it reaches 0 dB when the fixed band is fully attenuated. In critical applications, where a high sliding band threshold is desired, the arrangement of FIG. 14 allows the use of both wideband and frequency selective bucking action. In the case of a high frequency sliding band element, the frequency selective bucking signal is derived using a high pass filter (filter 152, FIG. 14) since the bucking action is most desirable at the high frequency extreme, where the equalized control amplifier provides the highest gain. In one practical embodiment described further below a cutoff frequency of 1.6 kHz is employed. For a low frequency sliding band element, the requirement is to provide high loop gain at high level low frequencies. In that case, the filter 152 in the arrangement of FIG. 14 is a low pass filter. In one practical embodiment described further below a cutoff frequency of 400 Hz is employed.

As mentioned above, a very useful arrangement is to provide a compressor or expander configured in the nature of bandsplitting high frequency and low frequency stages, each stage made up of sliding band and fixed band elements. The parallel stages can operate as stand alone dynamic range modification devices or as side paths in Type I or Type II dual path arrangements such as described in U.S. Pat. Nos. 3,846,719; 3,903,485; 28,426; and 4,490,691. Preferably, single pole filters with the same corner frequency in each are employed so that the combined quiescent response of the two stages is flat. An advantageous corner frequency for the high and low frequency stages is about 800 Hz for an audio system. With the gently sloping 6 dB/octave slope of the filters, if the high frequency stage has a corner frequency of 800 Hz, the stage provides significant action as low as 100 or 200 Hz. If the low frequency stage also has a corner frequency of 800 Hz, it provides significant action as high as 3 kHz to 6 kHz. Thus, for signals lying in the range of, say 100 Hz to 6 kHz, which is the band having most of the energy in typical music, both stages are effective and provide a signal tracking effect. For example, as explained further below, for a single dominant signal in that range, the overall response is that of two sliding bands, above and below the dominant signal. For more than one dominant signal the resulting characteristic is a fixed band response between the most upper and most lower dominant signals and sliding band responses above and below the most upper and most lower dominant signals, respectively.

In FIG. 18, an embodiment of a high frequency stage is shown. A single pole high pass filter 154 with a cutoff frequency of 800 Hz is located in its input. In practice the filter includes an operational amplifier so as to buffer the filter from the following circuitry. The high pass filtered input signal is applied to a fixed band element 156 and to a sliding band element 158. The fixed band element includes an input resistor 160, a shunt FET 162 operated as a variable resistor, and a control circuit 164 that generates a DC control signal which is applied to the gate of the FET 162. The FET resistance drops as the DC control signal level increases. Fixed band control circuit 164 includes in its loop a buffer amplifier 166, a single pole high pass filter 168 having about a 400 Hz cutoff frequency, a rectifier 172 (preferably full-wave), and a smoothing circuit 174 (which also is employed to adjust the attack and release time constants of the control loop). The sliding band element 158 includes parallel input resistor 178 and capacitor 180 which are shunted by FET 182. The sliding band element has a control circuit 184 which includes a buffer amplifier 186, a summing means 188, a high frequency emphasis circuit 190, a rectifier 192 (preferably full-wave), and a smoothing circuit 194. The summing circuit also receives as inputs bucking signals taken before and after a high pass filter 170 having about a 1.6 kHz cutoff frequency. The bucking signals are suitably buffered to avoid undesired interaction between the control circuits. The input to filter 170 is taken between filter 168 and rectifier 172. The output of the fixed band element 156 is applied to the sliding band element through buffer 198. The overall output is taken from buffer 186 of the sliding band element 158.

In operation, the stacked fixed band and sliding band elements operate generally in the manner described above. The coupling of bucking signal components from the fixed band element to the control circuit of the sliding band element are for the reasons set forth in connection with the description of FIG. 14, above. A corner frequency of about 1.6 kHz was chosen for filter 170 because differential control of the sliding band is needed only at high frequencies. Filter 168 is employed in order to reduce the sensitivity of the fixed band circuit to very low frequency components.

In FIG. 19, an embodiment of a low frequency stage is shown. The input signal is applied to a fixed band element 200 and to a sliding band element 202. The fixed band element includes an input resistor 204, a shunt FET 206 operated as a variable resistor, and a control circuit 208 that generates a DC control signal which is applied to the gate of the FET 206. The FET resistance drops as the DC control signal level increases. Control circuit 208 includes in its loop a buffer amplifier 210, a first single pole low pass filter 212 having a corner frequency of about 800 Hz, a second low pass filter 214 having a corner frequency of about 1.6 kHz, a rectifier 218 (preferably full-wave), and a smoothing circuit 220 (which also is employed to adjust the attack and release time constants of the control loop).

The sliding band element 202 includes parallel input resistor 224 and inductor 226 which are shunted by FET 228. In practice, the inductor 226 is simulated by a gyrator circuit which includes operational amplifiers (such circuits are well known and is not shown). The sliding band element has a control circuit 230 which includes a buffer amplifier 232, a single pole low pass filter 234 having a corner frequency of about 800 Hz, a summing circuit 236, a low frequency emphasis circuit 238, a rectifier 240 (preferably full-wave), and a smoothing circuit 242. Low pass filter 234 is preferably located in the position shown in order to assist in suppressing undesired noise generated in the low frequency stage. Alternatively, the filter may be located in the input to the arrangement as is done in the high frequency circuit of FIG. 18. The summing circuit 236 also receives as inputs bucking signals taken before and after a low pass filter 216 having a corner frequency of about 400 Hz. The bucking signals are suitably buffered to avoid undesired interaction between the control circuits. The input to filter 216 is taken between filter 214 and rectifier 218. The output of the fixed band element 200 is applied to the sliding band element through buffer 248. The overall output is taken from filter 234 of the sliding band element 202.

In operation, the low frequency stacked fixed band and sliding band elements operate generally in the manner described above except that the sliding band element operates downwardly in frequency. One difference in the low frequency stage, as noted above, is that the band defining filter is located in the stage output rather than in the input as in the high frequency stage. The coupling of bucking signal components from the fixed band element to the control circuit of the sliding band element are for the reasons set forth in connection with the description of FIG. 14, above. A corner frequency of about 400 Hz was chosen for filter 216 because differential control of the sliding band is needed only at low frequencies. Filters 212 and 214 are employed in order to reduce the sensitivity of the fixed band circuit to very high frequency components.

High frequency and low frequency stages of the type set forth in FIGS. 18 and 19 can be used as building blocks in creating compressors, expanders and noise reduction companders. For example, high frequency and low frequency stages of the type described in FIGS. 18 and 19 may be employed as side paths in dual path arrangements in the manner shown in FIGS. 20 and 21.

In FIG. 20 a Type I dual path arrangement (of the type generally described in U.S. Pat. No. 3,846,719) is shown having a compressor 248 in which the input signal is applied to the high frequency stage 250, to the low frequency stage 252 and to the main path 254. The outputs of stages 250 and 252 are summed in summing means 256 and then summed with the main path signal components in summing means 258 to provide the compressor output for application to a transmission channel. The side path signal components thus boost the main path signal components causing compressor action. The transmission channel output is applied to the expander 260, configured in a complementary manner to the compressor 248, which has an input summing means 262 which receives the transmission channel output and subtracts the sum of the high frequency stage 250 and low frequency stage 252 outputs, which are added in summing means 263. The main path 264 receives the output of summing means 262 and couples the signal components from that means to the the output and to the inputs of stages 250 and 252. The side path signal components thus buck the main path signal components causing expander action.

In FIG. 21 a Type II dual path arrangement (of the type generally described in U.S. Pat. No. 3,903,485) is shown having a compressor 268 which has an input summing means 270 receiving the input signal and the sum of the high frequency stage 250 and low frequency stage 252 outputs, which are combined in summing means 272. The summing means 272 has its output applied to the main path 274 which provides the compressor output to the transmission channel and the input to the stages 250 and 252 of the compressor. The side path signal components thus boost the main path signal components causing compressor action. The transmission channel output is applied to the expander 276, configured in a complementary manner to the compressor 268. The input signal is applied to the high frequency stage 250, to the low frequency stage 252 and to the main path 278. The outputs of stages 250 and 252 are summed in summing means 280 and then subtracted from the main path signal components in summing means 282 to provide the expander output. The side path signal components thus buck the main path signal components causing expander action.

In FIGS. 20 and 21 the main path of each compressor and expander is linear with respect to dynamic range and the level of the sum of the side path high frequency and low frequency stages is less than the maximum level of the main path. The transmission channel in those Figures and in FIGS. 22 and 23, below, may include any type of storage or transmission medium and may also include means for converting or encoding the analog signal components from the compressor into a different form (digital, for example), the storage or transmission of the encoded signals, and means for re-converting or decoding the encoded signals back into analog signal components.

In arrangements such as in FIGS. 20 and 21 where only one high frequency stage and one low frequency stage is used in each compressor and expander it is practical to provide a maximum of about 10 to 12 dB of noise reduction without reaching excessive maximum compression or expansion ratios. Although the arrangements of FIGS. 20 and 21 will be adequate in certain applications, it is useful to employ the teachings of U.S. Pat. No. 4,490,691 to achieve a greater amount of overall noise reduction without placing an undue burden on any one stage or creating excessive compression or expansion ratios.

In FIG. 22 one possible arrangement is shown in which there are three series Type I dual path stages in the compressor and three complementary stages in the expander. The threshold levels of the series bi-linear circuits are staggered, employing the staggering aspects of U.S. Pat. No. 4,490,691. Alternatively, a Type II configuration could be employed. The embodiment of FIG. 22 also employs the spectral skewing and antisaturation aspects of U.S. Pat. No. 4,490,691, although these aspects are not essential to a multi-stage arrangement employing high frequency and low frequency stages.

The compressor portion of the system of FIG. 22 has three stages: a high level stage 284, which has the highest threshold level; a mid-level stage 286; and a low level stage 288, which has the lowest threshold level. As discussed in U.S. Pat. No. 4,490,691 this is the preferred order of arrangement of staggered stages, although the reverse order is possible. The expander portion of the system of FIG. 22 also has three stages arranged complementary to the compressor: the low level stage 290, the mid-level stage 292, and the high level stage 294. Each high level and mid-level stage has both a high frequency stage 250 and a low frequency stage 252. The low level stage has only a high frequency stage 250 and no low frequency stage. Each high frequency stage 250 and each low frequency stage 252 is of the type described in connection with FIGS. 18 and 19. In practical circuits there may be some differences between or among high frequency and low frequency stages depending on whether it is located in the high level, mid-level or low level stage.

If each compressor stage (284, 286, 288) and each expander stage (290, 292, 292) has, for example, 8 dB of compression or expansion, respectively, then the overall compander system will provide 24 dB of noise reduction in the high frequency band (above 800 Hz, if the high frequency stages have an 800 Hz cutoff frequency) and 16 dB of noise reduction in the low frequency band (below 800 Hz, if the low frequency stages have an 800 Hz cutoff frequency). Such an arrangement is useful, for example, in a high quality audio noise reduction system of the type used in professional applications.

The cascading of staggered stages as in the embodiment of FIG. 22 is useful not only to increase the amount of compression and expansion but also to create a quasi-multi-pole effect (with respect to the band of the high frequency stages) and a quasi-two-pole effect (with respect to the band of the low frequency stages). Thus, while each circuit itself has only a single pole band determining filter, in order to allow for broad frequency overlap of the circuits and a flat overall frequency response when the bands are combined, the overall effect when two or three circuits are cascaded is to provide a steepness compounding or stage ganging effect: in effect, a two or three pole filter. The additional sharpness of a two or three pole filter is desirable in that it allows the system to track dominant signal components more effectively. That is, with steep filter slopes, frequencies adjacent to a dominant signal component are affected as little as possible by dynamic action. The quasi-two-pole and three-pole filter effect brings about that result while retaining the advantages of single pole filters in each individual circuit, namely that the outputs of the high and low frequency circuits combine perfectly in both amplitude and phase. The overall result is that the filter action becomes more complex as signals are applied by virtue of the multi-stage steepness compounding effect taken in combination with the quasi-two-pole filter effect in the noise reduction side paths of each circuit. The latter effect results from the use of a single pole fixed filter in series with a variable shelf characteristic in the sliding band portion of the circuits which has a single pole characteristic in its quiescent condition but which tends toward a two-pole characteristic in the presence of a dominant signal or signals. The intervention of the fixed bands, via action substitution, further tailors the response.

The input to the compressor portion of the system is applied to low frequency and high frequency spectral skewing networks shown as block 296. In a practical embodiment there are two networks in series: a two section low frequency network made up of a 50 Hz high pass single pole shelving section and a 20 Hz high pass single pole filter section; and a 12 kHz Butterworth (maximally flat) low pass filter network. Both networks may be implemented using well known operational amplifier active filter techniques. Complementary deskewing networks are located in block 304 at the output of the expander.

The main path of each stage 284, 286, and 288 in the compressor portion includes low frequency and high frequency antisaturation networks 298, 300, and 302, respectively. Complementary antisaturation networks 304, 306, and 308 are located in the main path of each stage 290, 292, and 294, respectively, in the expander portion. As discussed in U.S. Pat. Ser. No. 4,490,691, it is possible to locate such networks in the main path of only one stage in the compressor and in the complementary location in one stage in the expander portion of a series of cascaded staggered stages.

The Type I stages of FIG. 22 also include summing means 310, 312, 314 and 316 that combine the outputs of the high frequency and low frequency circuits in stages 284, 286, 292, and 294, respectively. The stages each include summing means 318, 320, 322, 324, 326, and 328 in the main paths which couple to the main path the side path output, in the case of stages 288 and 290, or the outputs of the side paths, in the case of the other stages.

The arrangement of FIG. 22 is only one example of compressor, expander or compander systems that can be constructed using the high frequency circuits and/or the low frequency circuits of the type described in connection with FIGS. 18 and 19. Other possibilities include, but are not limited to, (1) a single high frequency circuit in the compressor and expander; (2) one high frequency circuit and one low frequency circuit each in the compressor and expander (as in the examples of FIGS. 20 and 21); and (3) two high frequency circuits and one low frequency circuit each in the compressor and expander (e.g., an arrangement such as in FIG. 22, but omitting the high level stages 284 and 294). Alternative (1) would provide a degree of compatibility with widely used B-type consumer noise reduction systems licensed by Dolby Laboratories and alternative (3) would provide a degree of compatibility with the widely used A-type professional noise reduction systems manufactured by Dolby Laboratories. Other configurations are possible depending on the goals of the system designer. For example, a fourth stage could be added to the compressor and expander portions of the example of FIG. 22 and/or the low level stage of that example could additionally include a low frequency circuit.

In a practical embodiment of a system generally in accordance with the example of FIG. 22 it is possible to employ only one set of high level, mid-level and low level stages by using a unique circuit and switching arrangement. FIG. 23 is a block diagram of such a practical embodiment. The circuit and switching arrangement is applicable to all types of compander systems having series dual path stages in which simultaneous encoding and decoding is not required. A single pole double throw switch provides switching of the system from its compression mode to its expansion mode. In order to provide this simplicity in switching, the arrangement employs a supplemental main path in each stage except the last.

Referring to FIG. 23, the input to the system is through a bandpass filter 330 which is intended to remove subsonic and supersonic signals (for example, the filter may be comprised of a two pole high pass filter with about a 10 Hz cutoff frequency and a two pole low pass filter with about a 50 kHz cutoff frequency). The filtered input signal passes through first and second inverting buffer amplifiers 332 and 334 (configured as summing operational amplifiers with appropriate resistors 332a, 332b, 332c, 334a, 334b, and 334c) to the system output. The main path of the system is between amplifiers 332 and 334. At a point between buffers 332 and 334 the input to three paths is derived; the three paths include a first path 336 including a low frequency and high frequency spectral skewing network 338 feeding three stages (340, 342, 344), the first two (340, 342) having supplemental main paths (346, 348), a second path 350 which includes a low frequency and high frequency antisaturation network 352 and generates an antisaturation bucking signal, and a gain trimming path 354. Network 338 has the same characteristics described in connection with network 296 of FIG. 22. The effect of network 352 is to create similar characteristics as networks 298, 300, and 302 of FIG. 22, but further includes amplification means as may be necessary to generate a bucking signal of the proper level and polarity. Signal components from the three paths are combined in summing means 356, the output of which is applied to the switching arrangement 358. That is, network 352 has a low frequency and a high frequency boost characteristic so that when the signal is combined in a bucking sense the overall low frequency and high frequency antisaturation attenuation characteristics are obtained.

The first stage 340 is preferably the high level stage which includes a high frequency circuit 250 and a low frequency circuit 252, as in FIG. 22. The input to stage 340 is fed to circuits 250, 252 and the secondary main path 346. The output of each (e.g., 250, 252, 346) are combined in summing means 364. The second stage 342, the mid-level stage, receives the output of summing means 364 and applies that to further high frequency and low frequency stages, 250 and 252, respectively, and to secondary main path 348. The output of circuits 250, 252 and path 348 are combined in summing means 366 which applies its output to the low level stage 344 which consists of a high frequency circuit 250. The noise reduction outputs of the five circuits in stages 340, 342 and 344 are applied to combining means 356 along with the anti-saturation bucking signal from block 352 and the level trimming path 354.

The switching arrangement includes a single pole single throw noise reduction on/off switch 360 which grounds the output from summing means 356 in its closed, noise reduction "off", position and which is open in the noise reduction "on" position. The summing means 356 output is further applied to the common position of a single pole double throw switch 362. In the "compress" position, the summing means output is applied to a point between buffers 332 and 334. In the "expand" position, the summing means output is applied to the input of buffer 332.

In operation, closure of switch 360 to the noise reduction "off" position prevents the output of summing means 356 from being coupled to buffer 334 because it grounds one of its two summing inputs. As to the compress/expand mode switch 362, in the "compress" position the overall arrangement is essentially equivalent to that of a Type I compressor as shown in a portion of FIG. 22. That is, the input signal via buffer 332 is applied to the three paths 336, 350 and 354 and their sum is applied to the output via switch 362 and buffer 332. In the expand position of switch 362, the output of combining means 356 is fed back and is of opposite polarity to the input to the three paths, thus replicating the Type I expander configuration of FIG. 22. In either switch position, the output of combiner 356 is added to the input signal by amplifier 332 or amplifier 334. The same principles can be applied to a Type II compander system.

In addition to simplifying compressor/expander switching, the arrangement of FIG. 23 only requires a single spectral skewing network and a single antisaturation network. The use of a single spectral skewing network in the arrangement of FIG. 23 does result in one minor difference from the configuration of FIG. 22, namely that in FIG. 23 the network 338 affects only the side paths and does not affect the primary main path whereas in FIG. 22 the network 296 affects both the main and side paths. However, as set forth in U.S. Pat. Ser. No. 4,490,691, both locations are acceptable alternatives.

In a further practical embodiment of a system generally in accordance with the example of FIG. 22 it is also possible to employ only one set of high level, mid-level and low level stages by using a unique circuit and switching arrangement. FIG. 24 is a block diagram of such a practical embodiment. The circuit and switching arrangement is applicable to all types of compander systems having series dual path stages in which simultaneous encoding and decoding is not required. A single pole double throw switch provides switching of the system from its compression mode to its expansion mode. A further switch provides a noise reduction off position. Even greater simplicity is provided than in the embodiment of FIG. 23 in that no supplemental main paths are required. The amount of antisaturation required may be provided by only one low frequency and one high frequency antisaturation network as shown. The arrangement of FIG. 24 utilizes the encoder portion of FIG. 22 in parallel with an inverting amplifier such that the parallel combination when summed provides a derived noise reduction side path signal, e.g., the parallel combination effectively subtracts the main path signal from the main path plus noise reduction signal to provide the noise reduction signal by itself. By deriving the noise reduction signal in isolation, the overall system is easily switched from an encoding mode to a decoding mode as explained in connection with FIGS. 24 and 25.

Referring to FIG. 24, in which the same reference numerals are used as for like elements in FIGS. 22 and 23, the input to the system is through bandpass filter 330. The filtered input signal passes through first and second inverting buffer amplifiers 362 and 364 (configured as summing operational amplifiers with appropriate resistors 362a, 332b, 364a, and 364b) to the system output. At a point between buffers 362 and 364 the input to the encoder (compressor) portion of the system of FIG. 22 in parallel with the inverting amplifier 370 is derived. The main path of the system is provided between amplifier 362 and amplifier 364. The encoder output is applied to a summing resistor 368. The inverting amplifier path includes inverting operational amplifier 370, an input resistor 370a, feedback resistor 370b, and summing resistor 372. Resistors 370a and 370b are selected to provide unity gain. Summing resistors 368 and 372 have the same value so that when the encoder and inverting amplifier paths are summed in either amplifier 362 or 364 the resulting signal is the derived noise reduction signal.

Compress/expand switching is provided by a single pole two position switch 374 that has its common point connected to the junction of resistors 368 and 372. In the "compress" position, the summing resistors 368 and 372 are connected to the input of summing amplifier 364. The amplifier therefore sums the noise reduction signal with the main path signal to provide compression. In the "expand" position, the summing resistors 368 and 372 are connected to the input of summing amplifier 362. The amplifier therefor subtracts the noise reduction signal from the main path signal to provide expansion. In the "off" position of switch 375, the noise reduction signal is not connected and the output is simply the input.

The operation of the switching arrangement of FIG. 24 may be better understood by reference to FIG. 25 which shows the prior art switching arrangement for a single stage type I dual path compander system as described in U.S. Pat. Ser. Re 28,426. The input signal is applied to a first summing means 374. The main path 376 extends from summing means 374 to a second summing means 378. The noise reduction side path 380 (heretofore a single sub-circuit) derives its input from the main path and has its output switchable by switch 380 so as to sum with the main path in summing means 378 for compression and to subtract from or buck the main path by inversion in inverter 384 and summation in summing means 374. Switch 383 opens the NR side path for the off condition. The arrangement of FIG. 24 is based on the recognition that it is possible to simply derive a noise reduction side path signal representative of the overall noise reduction signal in a complex multistage system.

The arrangement of FIG. 24 can be modified by employing the decoder portion of FIG. 22 in place of the encoder portion. In addition, these principles are equally applicable to type II arrangements.

It will be noted that there is a further advantage of the arrangement of FIG. 24 over the arrangement of FIG. 23: the effect of the spectral skewing network in the arrangement of FIG. 24 is that same as in the configuration of FIG. 22; it affects both the main paths and the side paths. In this way, the spectral skewing network also provides an antisaturation effect at the extreme ends of the audio spectrum. This effect is over and above that provided by the antisaturation networks themselves.

FIG. 26 is a representation of the quiescent characteristics of the five circuits and the overall arrangement for a system configured such as the compressor portion of FIG. 22 or the systems of FIG. 23 and 24 operated in their compressor mode, in each case without the respective spectral skewing and anti-saturation networks. Each circuit 250 and 252 provides a maximum of 8 dB of compression for low level signal conditions below threshold. Thus, the curves show the additive effect of the two low frequency circuits and of the three high frequency circuits, providing an overall compression of 24 dB at high frequencies dropping to 16 dB at low frequencies. The curves also illustrate the substantial overlap of the 6 dB/octave skirts of the single pole filters. Reference should also be made to FIG. 7B described above, which illustrates the low level response of the same arrangement in the presence of dominant signals.

I claim:

1. A circuit for modifying the dynamic range of input signal components within a frequency band, comprising
a plurality of circuit elements, each having its own passive or dynamic characteristic action, at least one having a dynamic characteristic action, the characteristic actions operating at least partially within substantially the same frequency and level region, and
means for interconnecting the circuit elements such that for some level and spectral content of the input signal components the characteristic action of one circuit element substitutes for the characteristic action of another circuit element in at least a portion of the frequency band.

2. A circuit according to claim 1 wherein the means for interconnecting the circuit elements provides for characteristic action substitution by superposition of characteristics wherein an overall circuit characteristic action is derived from the individual characteristic actions of said plurality of circuit elements such that for any combination of level and spectral content of the input signal components an individual characteristic action defines the overall frequency band or individual characteristic actions each define portions of the overall frequency band, said individual characteristic action or characteristic actions which define all or a portion of the overall frequency band suppressing the effect of any other individual characteristic action or characteristic actions having less effect within the same frequency range.

3. A circuit according to claim 2 wherein the overall characteristic action for any combination of level and spectral content of input signal components has substantially no greater an effect at any frequency than any individual characteristic operable at that frequency.

4. A circuit according to claims 1, 2, or 3 wherein the or each element having a dynamic characteristic operates in accordance with a predetermined compression or expansion law.

5. A circuit according to claims 2 or 3 wherein there are at least two elements having a dynamic characteristic, the dynamic characteristic responding to the level and/or spectral content of signal components in the respective circuit element above a threshold.

6. A circuit according to claim 5 wherein there are two elements each having dynamic characteristic action, the dynamic characteristic action of one of said elements being a fixed band characteristic action and the dynamic characteristic of the other of said elements being a sliding band characteristic action.

7. A circuit according to claim 6 wherein the sliding band element includes a gyrator simulated component which inherently generates undesired noise, the circuit further comprising means for removing the gyrator simulated component from the circuit during signal conditions below said threshold.

8. A circuit according to claim 6 wherein the element having a fixed band characteristic action includes a control circuit and the circuit further comprises means for maintaining the fixed band element control circuit at a level just below its threshold when the level and spectral content of the input signal components are such that the fixed band element is below its threshold.

9. A circuit according to claim 8 wherein the sliding band characteristic also has a quiescent condition, the circuit further comprising means for moving the sliding band characteristic away from its quiescent condition when the level and spectral content of the input signal components are such that the fixed band element is below its threshold.

10. A circuit according to claim 6 wherein the sliding band characteristic has a quiescent condition, the circuit further comprising means for moving the sliding band characteristic away from its quiescent condition when the level and spectral content of the input signal components are such that the fixed band element is below its threshold.

11. A circuit according to claim 5 further comprising means for coupling signal components between or among said elements having dynamic characteristic action to affect the threshold level of one or more of said elements.

12. A circuit according to claim 11 wherein said means for coupling signal components includes filter means for restricting the frequency band of the coupled signal components.

13. A circuit according to claim 11 wherein said elements having dynamic characteristic action include means for deriving a control signal, said means for coupling signal components including means for differentially deriving the control signal within an element so that the control signal is substantially unaffected by the signal output(s) of another element or other elements.

14. A circuit according to claim 2 wherein said means for interconnecting the circuit elements interconnects said circuit elements such that the output of the circuit is effectively the sum of the individual outputs of said circuit elements and the effective input to each circuit element is a differential signal component derived from said input signal and one or more of the individual outputs or a reference potential.

15. A circuit according to claim 14 wherein said elements are each represented as a three-terminal network wherein each first terminal is a primary input terminal, each second terminal is a secondary input terminal and each third terminal is an output terminal, the input signal being coupled to each of said first terminals, the elements being ordered in a stack wherein the second terminal of a first element is coupled to a reference potential, and the third terminal of each succesive element is coupled to the second terminal of a successive element, and the output is derived from the third terminal of the last element in the stack.

16. A circuit according to claim 15 wherein the stack of elements includes at least one branch such that the third terminal of an element is coupled to the second terminal of two or more elements which in turn have the output derived from their third terminal or have their third terminal coupled to the second terminal of one or more elements in the stack.

17. A circuit according to claim 2 wherein the circuit is a dual-path circuit in which said plurality of circuit elements and means for interconnecting the circuit elements include a further path, the circuit further comprising a main path which is linear with respect to dynamic range, a combining circuit in the main path, said further path having its input coupled to the input or output of the main path and its output coupled to the combining circuit, the further path providing a signal which, at least in a part of the frequency band, boosts or bucks the main path signal by way of the combining circuit, but which is so limited that, in the upper part of the input dynamic range, the further path signal is limited to a value smaller than the main path signal.

18. A circuit according to claim 17 wherein the further path itself includes a plurality of series circuits, all but the last in the series of said series circuits being a dual-path circuit, and further combining means for summing the outputs of the further path(s) of the dual-path series circuit(s) and the output of the last series circuit to provide the further path signal of the overall dual path circuit, whereby the main path or paths in said series circuit or circuits constitute secondary main paths.

19. A circuit according to claim 18 further comprising means including a single pole switch for selectively applying the further path signal of the overall dual path circuit to boost or buck the overall main path signal.

20. A circuit according to claim 18 further comprising yet a further path for the overall dual path circuit, including therein means for generating an equalization signal, said yet a further path having its input coupled to the input or the output of the main path and its output coupled to the combining circuit, the yet a further path providing an equalization signal which, at least in a part of the frequency band, boosts or bucks the main path signal by way of the combining circuit.

21. A circuit according to claim 17 wherein the further path itself includes a plurality of series circuits, at least one of said series circuits being a dual-path circuit, the circuit further comprising means in parallel with the plurality of series circuits for inverting the input signal to said further path, and means including a single pole switch for selectively applying the further path signal summed with the inverted input signal to the further path to boost or buck the overall main path signal.

22. A circuit according to claim 17 further comprising yet a further path including therein means for generating an equalization signal, said yet a further path having its input coupled to the input or the output of the main path and its output coupled to the combining circuit, the yet a further path providing an equalization signal which, at least in a part of the frequency band, boosts or bucks the main path signal by way of the combining circuit.

23. A combination of circuits according to claims 2 or 3 wherein each circuit operates only in a portion of the overall frequency band, the combination of the circuits providing modification of the dynamic range of input signal components throughout the overall frequency band.

24. The combination of circuits according to claim 23 wherein there are two circuits operating, respectively, in the upper part of the frequency band and in the lower part of the frequency band.

25. The combination of circuits according to claim 24 wherein the circuits are for use at audio frequencies and the circuit operating in the upper part of the frequency band operates mainly above 800 Hz and the circuit operating in the lower part of the frequency band operates mainly below 800 Hz.

26. A circuit according to claim 1 wherein the circuit is for compressing the dynamic range of input signal components within a frequency band, said means for interconnecting providing characteristic action substitution or augmentation such that for very low level signal components the transmission through the circuit tends to be maximized.

27. A circuit according to claim 1 wherein the circuit is for expanding the dynamic range of input signal components within a frequency band, said means for interconnecting providing characteristic action substitution or augmentation such that for very low level signal components the transmission through the circuit tends to be minimized.

28. A method for conformally equalizing input signal components within a frequency band, comprising
providing a plurality of characteristics actions, at least one having a dynamic characteristic action, the characteristic actions operating at least partially within substantially the same frequency and level region, and
substituting one characteristic action with another characteristic action in at least a portion of the frequency band for some level and spectral content of the input signal components.

29. A method for modifying the dynamic range of input signal components within a frequency band, comprising
selecting two circuit characteristic actions represented by the voltage transfer functions $t_1(s)$ and $t_2(s)$, respectively, at least one characteristic action being dynamic, the characteristic actions operating at least partially within substantially the same frequency and level region, and
operating the circuit characteristics such that when input signal components are applied, represented by the voltage $V_{in}$, the output voltage $V_{out}$ is represented by $$V_{out} = V_{in}[t_1(s) + t_2(s) - t_1(s)t_2(s)].$$

30. A method for modifying the dynamic range of input signal components within a frequency band, comprising
selecting three circuit characteristic actions represented by the voltage transfer functions $t_1(s)$, $t_2(s)$, and $t_3(s)$, respectively, at least one characteristic action being dynamic, the characteristic actions operating at least partially within substantially the same frequency and level region, and
operating the circuit characteristics such that when input signal components are applied, represented by the voltage $V_{in}$, the output voltage $V_{out}$ is represented by $$V_{out} = V_{in}[t_1(s) + t_2(s) + t_3(s) - t_1(s)t_2(s) - t_1(s)t_3(s) - t_2(s)t_3(s) + t_1(s)t_2(s)t_3(s)].$$

31. A circuit for modifying the dynamic range of input signal components within a frequency band, comprising two circuit elements, each having its own passive or dynamic characteristic action represented by the voltage transfer functions t₁ (s) and t₂ (s), respectively, at least one having a dynamic characteristic action, the characteristic actions operating at least partially within substantially the same frequency and level region, and means for interconnecting the circuit elements such that when input signal components are applied, represented by the voltage $V_{in}$, the output voltage $V_{out}$ is represented by $$V_{out} = V_{in}[t_1(s) + t_2(s) - t_1(s)t_2(s)].$$

32. A circuit for modifying the dynamic range of input signal components within a frequency band, comprising three circuit elements, each having its own passive or dynamic characteristic action represented by the voltage transfer functions t₁(s), t₂(s), and t₃(s), respectively, at least one having a dynamic characteristic action, the characteristic actions operating at least partially within substantially the same frequency and level region, and means for interconnecting the circuit elements such that when input signal components are applied, represented by the voltage $V_{in}$, the output voltage $V_{out}$ is represented by $$V_{out} = V_{in}[t_1(s) + t_2(s) + t_3(s) - t_1(s)t_2(s) - t_1(s)t_3(s) - t_2(s)t_3(s) + t_1(s)t_2(s)t_3(s)].$$

33. A circuit selectably switchable as a compressor or an expander for modifying the dynamic range of input signal components within a frequency band, comprising a circuit path including a plurality of series dual-path stages, forming a compressor or expander, each of said dual-path stages including a main path which is linear with respect to dynamic range, a combining circuit in the main path, and a further path which has its input coupled to the input or output of the main path and its output coupled to the combining circuit, the further path providing a signal which at least in a part of the frequency band, boosts the main path signal in the compressor means and bucks the main path signal in the expander means, by wy of combining circuit, but which in each case is so limited that, in the upper part of the input dynamic range, the further path signal is limited to a value smaller than the main path signal.

means in parallel with said circuit path for input signal to said circuit path, and an overall dual-path circuit, including a further main path which is linear with respect to dynamic range, and means including a single pole switch for selectively applying the output of said circuit path summed with the inverted input to said circuit path to boost or buck the further main path signal.

34. A circuit for modifying the dynamic range of input signal components within a frequency band, comprising a plurality of dynamic action stages connected in series, the stages having staggered thresholds, at least two of said stages including first and second substages, the first and second substages each having a single pole band determining filter, the band determining filter in each of said first substages having substantially the same high pass frequency characteristic and corner frequency, and the band determining filter in each of said second substages having substantially the same low pass frequency characteristic and corner frequency, all of said corner frequencies being substantially the same, whereby the overall effect of the series stages provides a quasi-multi-pole effect.

35. The circuit of claim 34 wherein each of said stages comprises a dual path circuit, said dual-path circuit including a main path which is linear with respect to dynamic range, a combining circuit in the main path, two further paths comprising said first and second substages having their inputs coupled to the input or output of the main path and their outputs coupled to the combining circuit, the further paths providing a signal which, at least in a part of the frequency band, boosts or bucks the main path signal by way of the combining circuit, but which is so limited that, in the upper part of the input dynamic range, the further path signal is limited to a value smaller than the main path signal for most signal conditions.

36. A circuit for modifying the dynamic range of input signal components within a frequency band, comprising an active circuit element producing undesired noise, said active circuit element having a characteristic dynamic action operating in accordance with a predetermined compression or expansion law. When the input signal components are above a threshold, the circuit further comprising means for removing the element from the circuit when the input signal components are below said threshold so that the element does not contribute noise to the circuit output.

* * * * *

UNITED STATES PATENT AND TRADEMARK OFFICE
CERTIFICATE OF CORRECTION

PATENT NO. : 4,736,433
DATED : April 5, 1988
INVENTOR(S) : Dolby

It is certified that error appears in the above-identified patent and that said Letters Patent is hereby corrected as shown below:

Col. 32, line 63: "succesive" should be --successive--;
Col. 34, line 25: "characteristics" should be --characteristic--;
Col. 35, line 54: "wy" should be --way--;
Col. 36, line 3: insert --inverting the-- between "for" and "input";
Col. 36, line 48: delete the "."; and
Col. 36, line 49: "When" should be --when--.

Signed and Sealed this

Ninth Day of August, 1988

Attest:

DONALD J. QUIGG

*Attesting Officer*   *Commissioner of Patents and Trademarks*

UNITED STATES PATENT AND TRADEMARK OFFICE
CERTIFICATE OF CORRECTION

PATENT NO. : 4,736,433

DATED : April 5, 1988

INVENTOR(S) : RAY MILTON DOLBY

It is certified that error appears in the above-identified patent and that said Letters Patent is hereby corrected as shown below:

Column 5, Line 13: "maximimized" should be --maximized--
Column 7, Line 2: delete "an" before "another"
Column 11, Line 54: "receivin" should be --receiving--
Column 13, Line 50: "over" should be --overall--
Column 14, Line 2: "[t(s)" should be --$[t_1(s)$--
Column 14, Line 2: add --(-- before "Eqn"
Column 15, Line 41: "18" should be --34--
Column 15, Line 65: delete last word in line, "the"
Column 22, Line 21: after "No." and before "28,426" add --Re--
Column 23, Line 7: before "28,426" insert --Re--
Column 26, Line 37: "(290, 292, 292)" should be --(290, 292, 294)--
Column 27, Line 32: delete "Ser."
Column 29, Line 41: delete "Ser."
Column 30, Line 42: delete "Ser."
Column 36, Line 2: "." should be --,--

Signed and Sealed this

Eighth Day of May, 1990

*Attest:*

HARRY F. MANBECK, JR.

*Attesting Officer*     *Commissioner of Patents and Trademarks*